United States Patent
Cho et al.

(10) Patent No.: US 11,569,565 B2
(45) Date of Patent: Jan. 31, 2023

(54) ELECTRONIC DEVICE INCLUDING HIGH-FREQUENCY TRANSMISSION CIRCUIT

(71) Applicant: Samsung Electronics Co., Ltd., Gyeonggi-do (KR)

(72) Inventors: Han-Min Cho, Gyeonggi-do (KR); Chan-Gi Park, Gyeonggi-do (KR); Yeon-Sang Yun, Gyeonggi-do (KR); Tae-Wook Ham, Gyeonggi-do (KR); Hei-Seong Kwak, Gyeonggi-do (KR); Byoung-Il Son, Gyeonggi-do (KR); Sung-Chul Park, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/225,509

(22) Filed: Apr. 8, 2021

(65) Prior Publication Data

US 2021/0226320 A1 Jul. 22, 2021

Related U.S. Application Data

(60) Division of application No. 16/939,708, filed on Jul. 27, 2020, now Pat. No. 10,978,789, which is a
(Continued)

(30) Foreign Application Priority Data

Jun. 13, 2016 (KR) .......................... 10-2016-0073355

(51) Int. Cl.
*H05K 1/11* (2006.01)
*H01Q 1/24* (2006.01)
(Continued)

(52) U.S. Cl.
CPC ............... *H01Q 1/243* (2013.01); *H01Q 1/38* (2013.01); *H01Q 5/35* (2015.01); *H01Q 21/28* (2013.01);
(Continued)

(58) Field of Classification Search
CPC ............ H01Q 1/243; H01Q 5/35; H01Q 1/38; H01Q 21/28; H01R 12/79
(Continued)

(56) References Cited

U.S. PATENT DOCUMENTS

| 4,845,311 A | 7/1989 | Schreiber et al. |
| 7,781,680 B2 | 8/2010 | Pai et al. |

(Continued)

FOREIGN PATENT DOCUMENTS

| EP | 2 180 769 | 4/2010 |
| JP | 3200098 | 10/2015 |

(Continued)

OTHER PUBLICATIONS

International Search Report dated Sep. 19, 2017 issued in counterpart application No. PCT/KR2017/006070, 7 pages.
(Continued)

*Primary Examiner* — Andargie M Aychillhum
(74) *Attorney, Agent, or Firm* — The Farrell Law Firm, P.C.

(57) ABSTRACT

Disclosed is an electronic device comprising a first component, a second component, and a signal path interface coupled between the first component and the second component, the signal path interface including a printed circuit board (PCB) having a rigid PCB portion and a flexible PCB portion, wherein a first signal line and a second signal line extend through the rigid PCB portion and the flexible PCB portion for transmitting signals from the first component to the second components, and a plurality of ground lines
(Continued)

extend through the rigid PCB portion and the flexible PCB portion, and wherein each of the plurality of ground lines extending through the rigid PCB portion is connected to one or more conductive layers through conductive vias.

5 Claims, 14 Drawing Sheets

Related U.S. Application Data continuation of application No. 15/621,687, filed on Jun. 13, 2017, now Pat. No. 10,727,568.

(51) Int. Cl.

| | |
|---|---|
| H01Q 5/35 | (2015.01) |
| H05K 1/02 | (2006.01) |
| H01Q 21/28 | (2006.01) |
| H01Q 1/38 | (2006.01) |
| H01R 12/79 | (2011.01) |
| H01R 13/66 | (2006.01) |
| H05K 1/14 | (2006.01) |
| H05K 1/18 | (2006.01) |
| H05K 7/14 | (2006.01) |

(52) U.S. Cl.
CPC ......... *H01R 12/79* (2013.01); *H01R 13/6691* (2013.01); *H05K 1/028* (2013.01); *H05K 1/0218* (2013.01); *H05K 1/0243* (2013.01); *H05K 1/115* (2013.01); *H05K 1/142* (2013.01); *H05K 1/148* (2013.01); *H05K 1/18* (2013.01); *H05K 7/1427* (2013.01); *H05K 2201/0999* (2013.01); *H05K 2201/09609* (2013.01); *H05K 2201/10098* (2013.01)

(58) Field of Classification Search
USPC ........................................................ 361/790
See application file for complete search history.

(56) References Cited

U.S. PATENT DOCUMENTS

| | | | |
|---|---|---|---|
| 8,022,309 B2 | 9/2011 | Pai et al. | |
| 8,143,526 B2 | 3/2012 | Hsu | |
| 8,263,873 B2 | 9/2012 | Choi et al. | |
| 8,633,394 B2 | 1/2014 | Lai et al. | |
| 9,337,993 B1* | 5/2016 | Lugthart | H04L 7/0062 |
| 2006/0270472 A1 | 11/2006 | Chen et al. | |
| 2009/0260859 A1 | 10/2009 | Pai et al. | |
| 2009/0294155 A1 | 12/2009 | Suzuki et al. | |
| 2011/0094784 A1 | 4/2011 | Muro et al. | |
| 2012/0229346 A1 | 9/2012 | Chen et al. | |
| 2013/0063914 A1 | 3/2013 | Lin et al. | |
| 2013/0257659 A1 | 10/2013 | Darnell et al. | |
| 2014/0147128 A1 | 5/2014 | Han | |
| 2014/0225806 A1 | 8/2014 | Lee et al. | |
| 2015/0035706 A1 | 2/2015 | Darnell et al. | |
| 2015/0223323 A1 | 8/2015 | O'Flynn | |
| 2015/0234426 A1 | 8/2015 | Bailey | |
| 2016/0028148 A1 | 1/2016 | Tan et al. | |
| 2016/0205224 A1* | 7/2016 | Chini | H04W 84/04 |
| | | | 455/422.1 |

FOREIGN PATENT DOCUMENTS

| | | |
|---|---|---|
| KR | 101261983 | 5/2013 |
| KR | 1020130081450 | 7/2013 |
| KR | 101305518 | 9/2013 |
| KR | 1020140067430 | 6/2014 |
| KR | 20140136634 | 12/2014 |
| KR | 1020140139520 | 12/2014 |
| KR | 20150062059 | 6/2015 |

OTHER PUBLICATIONS

Samsung Galaxy et al: "Samsung Galaxy S7 Teardown Geschrieben von: Jeff Suovanen", IFIXIT Guide, XP055578568, Mar. 8, 2016, 19 pages.

European Search Report dated Apr. 17, 2019 issued in counterpart application No. 17813538.0-1203, 11 pages.

European Search Report dated Feb. 5, 2020 issued in counterpart application No. 17813538.0-1203, 12 pages.

Indian Examination Report dated Jun. 30, 2021 issued in counterpart application No. 201837042738, 5 pages.

Korean Office Action dated Oct. 27, 2022 issued in counterpart application No. 10-2016-0073355, 12 pages.

* cited by examiner

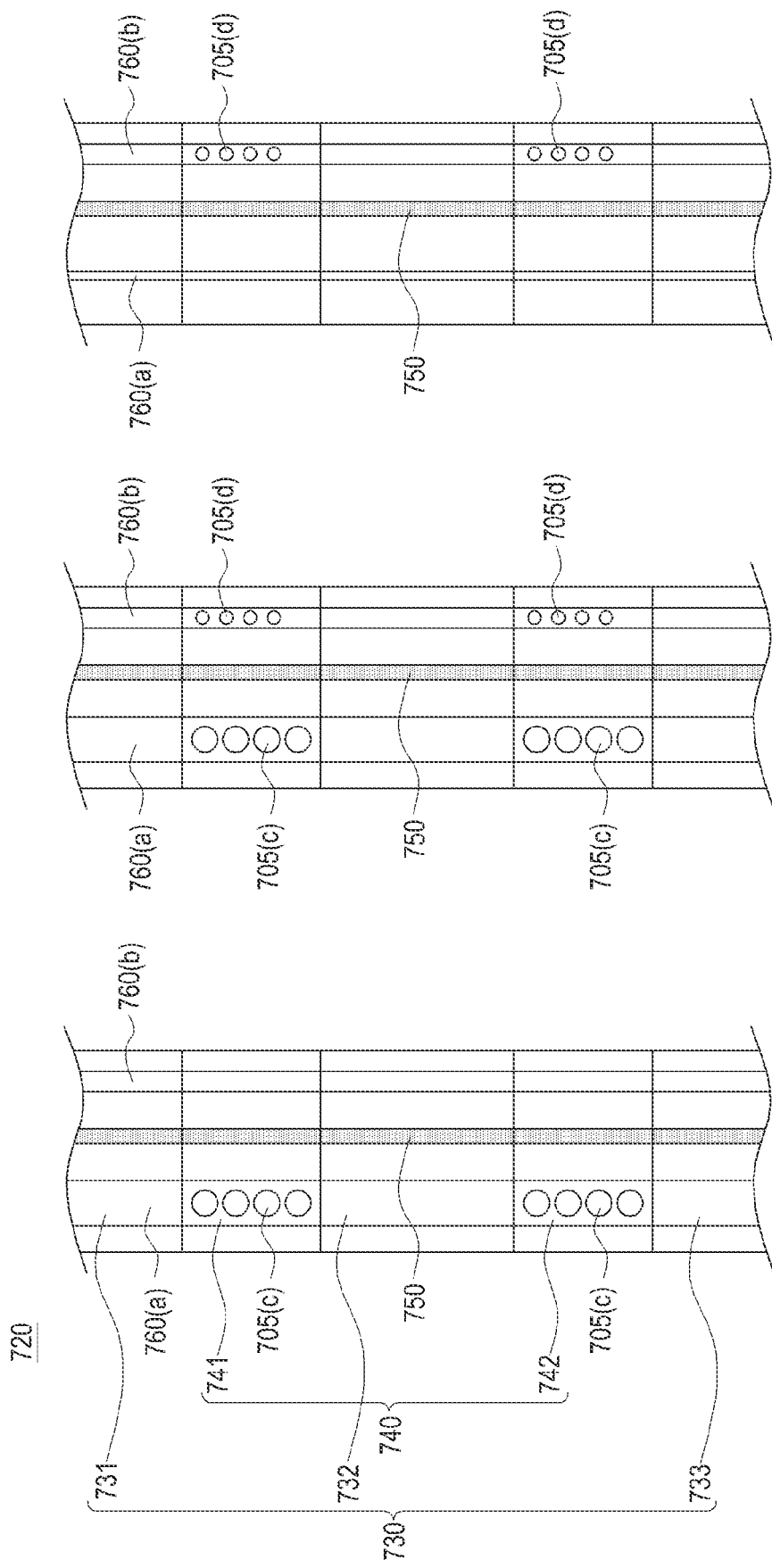

ELECTRONIC DEVICE INCLUDING HIGH-FREQUENCY TRANSMISSION CIRCUIT

PRIORITY

This application is a Divisional Application of U.S. patent application Ser. No. 16/939,708, filed on Jul. 27, 2020, which is a Continuation Application of U.S. patent application Ser. No. 15/621,687, filed on Jun. 13, 2017, now U.S. Pat. No. 10,727,568, issued Jul. 28, 2020, and claims priority under 35 U.S.C. § 119(a) to a Korean Patent Application filed on Jun. 13, 2016 in the Korean Intellectual Property Office and assigned Serial No. 10-2016-0073355, the contents of each of which are incorporated herein by reference.

BACKGROUND

1. Field of the Disclosure

The present disclosure relates generally to a high-frequency transmission circuit included in an electronic device, and more particularly, to a transmission line capable of effectively transmitting a noiseless high-frequency signal in a narrow space without affecting other modules.

2. Description of the Related Art

Recently, portable terminals having new functions have been rapidly developed and have accounted for a greater part of people's lives with the common use thereof.

Internal circuits of portable terminals are generally implemented on printed circuit boards (PCBs). PCB technologies have been rapidly developing, and flexible PCBs (FPCBs) that can be bent easily are currently used widely, as well as conventional rigid. PCBs.

In addition, coaxial cables are typically used for high-frequency transmission lines (especially, radio frequency (RF) lines) that are applied to wireless terminals. A large amount of additional material cost may be required to produce coaxial cables used for electronic devices as high-frequency transmission lines, and additional labor cost may be incurred by an increase in the number of assembly steps. In another example, electronic devices have narrow internal spaces available on account of various types of circuit modules mounted therein, and due to the narrow internal spaces, a defect rate may increase when small connectors used for coaxial cables are assembled.

SUMMARY

An aspect of the present disclosure provides a transmission line capable of effectively transmitting a noiseless high-frequency signal in a narrow space without affecting other modules.

Another aspect of the present disclosure provides that a coaxial cable used as a transmission line in a portable terminal can be replaced by a circuit board that includes an FPCB, and thus it is possible to eliminate material costs associated with the manufacture of a coaxial cable.

Another aspect of the present disclosure provides a rigid PCB that is disposed between transmission lines of an FPCB, whereby it is possible to reduce line loss occurring in the transmission lines of the FPCB and to provide a high-frequency signal without loss.

Another aspect of the present disclosure provides that it is possible to efficiently use a mounting space in a wireless terminal, which enables diversification of the external design of the wireless terminal to improve customer satisfaction.

In accordance with an aspect of the present disclosure, an electronic device is provided. The electronic device includes a first component, a second component, and a signal path interface coupled between the first component and the second component, the signal path interface including a PCB having a rigid PCB portion and a flexible PCB portion, wherein a first signal line and a second signal line extend through the rigid PCB portion and the flexible PCB portion for transmitting signals from the first component to the second components, and a plurality of ground lines extend through the rigid PCB portion and the flexible PCB portion, and wherein each of the plurality of ground lines extending through the rigid PCB portion is connected to one or more conductive layers through conductive vias.

BRIEF DESCRIPTION OF THE DRAWINGS

The above and other aspects, features, and advantages of the present disclosure will be more apparent from the following detailed description, taken in conjunction with the accompanying drawings, in which:

FIG. 2 is taken along line B-B' of FIG. 1;

FIG. 3 is taken along line B-B' of FIG. 1;

FIGS. 6A, 6B, 6C, 7A, 7B, and 7C are front views of conductive vias according to an embodiment of the present disclosure, the conductive vias being arranged in PCBs in electronic devices;

DETAILED DESCRIPTION OF EMBODIMENTS OF THE DISCLOSURE

Figure 1:
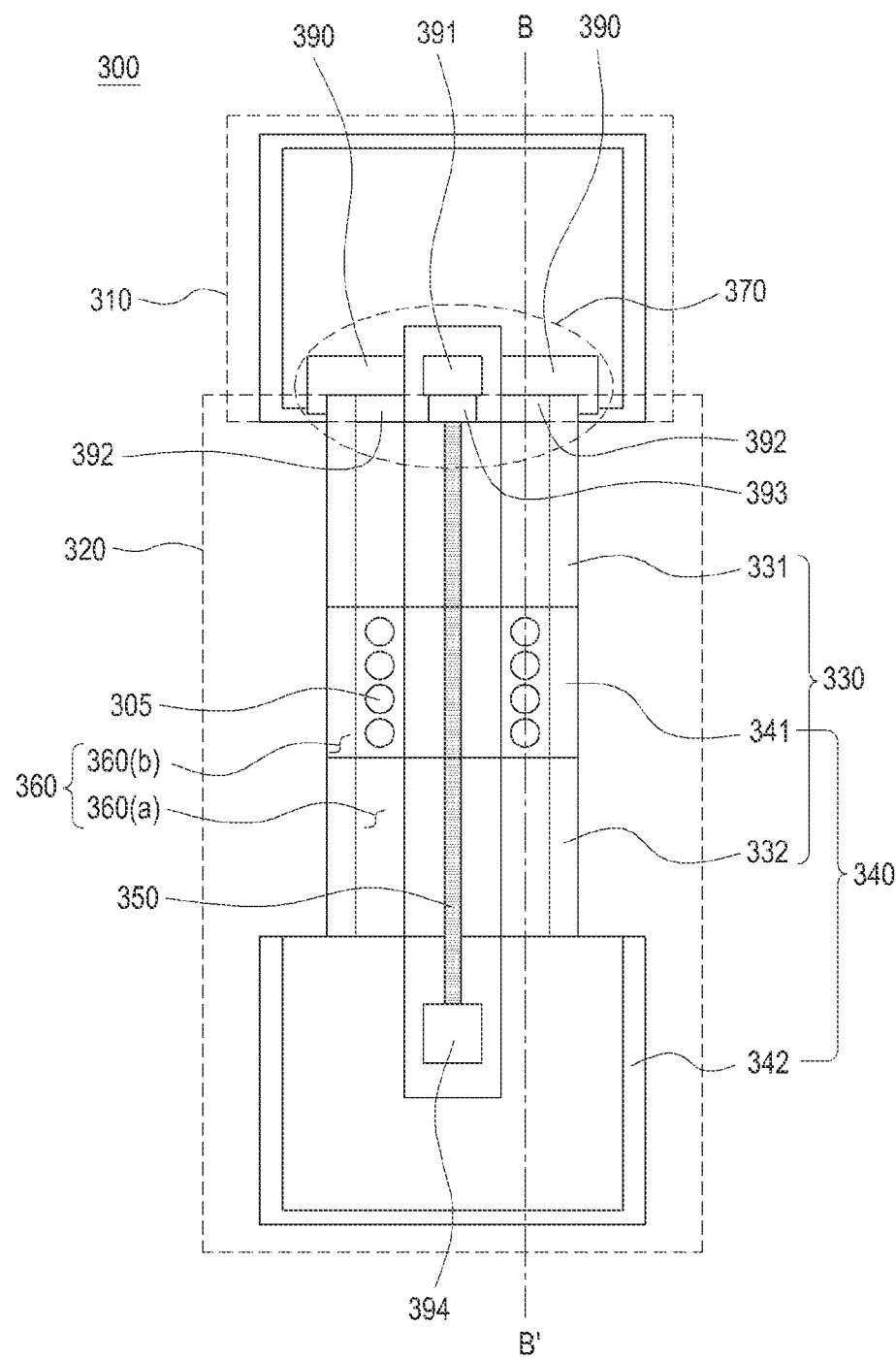
FIG. 1 is a front view of a high-frequency transmission line according to an embodiment of the present disclosure, in which a PCB in an electronic device is used for the high-frequency transmission line.

Hereinafter, various embodiments of the present disclosure are described with reference to the accompanying drawings. However, it should be understood that there is no intent to limit the present disclosure to the particular forms disclosed herein; rather, the present disclosure is intended to be construed to cover various modifications, equivalents, and/or alternatives of embodiments of the present disclosure. In the description of the accompanying drawings, similar reference numerals may be used to designate similar elements.

As used herein, the expressions "have", "may have", "include", or "may include" refer to the existence of a corresponding feature (e.g., numeral, function, operation, or element such as a component), and do not exclude one or more additional features.

In the present disclosure, the expressions "A or B", "at least one of A and/or B", and "one or more of A and/or B" may include all possible combinations of the items listed. For example, the expressions "A or B", "at least one of A and B", and "at least one of A or B" refer to all of (1) including at least one A, (2) including at least one B, and (3) including all of at least one A and at least one B.

The expressions "a first", "a second", "the first", or "the second" used in various embodiments of the present disclosure may modify various components regardless of the order and/or the importance of the components but are not not intended to limit the corresponding components. For example, a first user device and a second user device indicate different user devices although both of them are user devices. For example, a first element may be referred to as a second element, and similarly, a second element may be referred to as a first element without departing from the scope of the present disclosure.

It should be understood that when an element (e.g., a first element) is referred to as being (operatively or communicatively) "connected," or "coupled," to another element (e.g., a second element), the element may be directly connected or directly coupled to the other element or any other element (e.g., a third element) may be interposer between them. In contrast, it may be understood that when an element (e.g., a first element) is referred to as being "directly connected," or "directly coupled" to another element (e.g., a second element), there is no element (e.g., a third element) interposed between them.

The expression "configured to" used in the present disclosure may be used interchangeably with the expressions, for example, "suitable for", "having the capacity to", "designed to", "adapted to", "made to", and "capable of" according to the situation. The term "configured to" may not necessarily imply "specifically designed to" in hardware. Alternatively, in some situations, the expression "device configured to" may indicate that the device, together with other devices or components, "is able to". For example, the expression "processor adapted (or configured) to perform A, B, and C" may indicate a dedicated processor (e.g., an embedded processor) only for performing the corresponding operations or a general purpose processor (e.g., a central processing unit (CPU) or an application processor (AP)) that can perform the corresponding operations by executing one or more software programs stored in a memory device.

The terms used herein are merely used for the purpose of describing particular embodiments but are not intended to limit the scope of the present disclosure. A singular expression may include a plural expression unless they are definitely different in a context. Unless defined otherwise, all terms used herein, have the same meanings as those commonly understood by a person skilled in the art to which the present disclosure pertains. Such terms as those defined in a generally used dictionary may be interpreted to have the meanings equal to the contextual meanings in the relevant field of art, and are not intended to be interpreted to have ideal or excessively formal meanings unless clearly defined in the present disclosure. In some cases, even the terms defined in the present disclosure are not intended to be interpreted to exclude embodiments of the present disclosure.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a moving picture experts group (MPEG-1) audio layer-3 (MP3) player, a mobile medical device, a camera, and a wearable device. According to various embodiments of the present disclosure, the wearable device may include at least one of an accessory type (e.g., a watch, a ring, a bracelet, an anklet, a necklace, glasses, a contact lens, or a head-mounted device (HMD)), a fabric or clothing integrated type (e.g., electronic clothing), a body-mounted type (e.g., a skin pad, or tattoo), and a bio-implantable type (e.g., an implantable circuit).

According to an embodiment of the present disclosure, the electronic device may be a home appliance. A home appliance may include at least one of, for example, a television, a digital video disk (DVD) player, an audio player, a refrigerator, an air conditioner, a vacuum cleaner, an oven, a microwave oven, a washing machine, an air cleaner, a set-top box, a home automation control panel, a security control panel, a TV box (e.g., Samsung HomeSync®, Apple TV®, or Google TV™), a game console (e.g., Xbox® and PlayStation®), an electronic dictionary, an electronic key, a camcorder, and an electronic photo frame.

According to an embodiment of the present disclosure, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, security devices, an automotive head unit, a robot for home or industry, an automated teller machine (ATM), point of sales (POS) device in a shop, or an Internet of Things (IoT) device (e.g., a light bulb, various sensors, electric or gas meter, a sprinkler device, a fire alarm, a thermostat, a streetlamp, a toaster, sporting goods, a hot water tank, a heater, a boiler, etc.).

According to an embodiment of the present disclosure, an electronic device may include at least one of a part of furniture or a building/structure, an electronic board, an electronic signature receiving device, a projector, and various types of measuring instruments (e.g., a water meter, an electric meter, a gas meter, and a radio wave meter). An electronic device may be a combination of one or more of the aforementioned various devices. An electronic device may also be a flexible device. Further, an electronic device is not intended to be limited to the aforementioned devices, but may include an electronic device to be developed in the future.

Hereinafter, an electronic device according to various embodiments of the present disclosure is described with reference to the accompanying drawings. In the present disclosure, the term "user" may indicate a person using an electronic device or a device (e.g., an artificial intelligence electronic device) using an electronic device.

FIG. 1 is a front view of a high-frequency transmission line according to an embodiment of the present disclosure, in which a PCB 300 in an electronic device is used for the high-frequency transmission line. The electronic device may be a smart phone or a wearable device.

Referring to FIG. 1, the electronic device may include a housing corresponding to a case; a printed circuit unit including at least one PCB 300 in the housing; and an electrical path 350 passing over or through the printed circuit board 300.

The PCB 300 according to an embodiment of the present disclosure may be a first PCB 310 and a second PCB 320. For example, the first PCB 310 may be a main board on which electronic components included in the electronic device are mounted, the main board being capable of transmitting signals between the electronic components, and the second PCB 320 may be a sub-board that transmits signals generated by the electronic components. The sub-board may further include the electronic components.

The PCB 300 according to an embodiment of the present disclosure may be provided with a circuit of a terminal, which may be, for example, at least one of an AP, a communication processor (CP), a memory, and an RF transceiver, and may include a signal line (for example, an RF signal line).

The first and second PCBs 310 and 320 according to an embodiment of the present disclosure may be formed of a plurality of layers, and the plurality of layers may include one or more conductive layers 306 in FIG. 2 described below and one or more insulation layers 303.

The first PCB 310 in FIG. 1 according to an embodiment of the present disclosure may be a rigid PCB. The first PCB 310 may be electrically connected to the second PCB 320 through a connector 370. The connector 370 may include a ground pad 390 and a signal pad 391 of the first PCB 310 and a ground pad 392 and a signal pad 393 of the second PCB 320. The ground pad 390 of the first PCB 310 and the ground pad 392 of the second PCB 320 may be connected together by soldering. The signal pad 391 of the first PCB 310 and the signal pad 393 of the second PCB 320 may be connected together by soldering. The second PCB 320 may include an interconnection pad 394. An antenna contact member (for example, a C-clip) or an RF component (for example, a matching circuit) may be mounted on the interconnection pad 394.

The second PCB 320 according to an embodiment of the present disclosure may be connected to the first PCB 310 and may include an FPCB 330 or a rigid PCB 340. The FPCB 330 and the rigid PCB 340 of the second PCB 320 may be integrated with each other. For example, a first FPCB 331, a first rigid printed circuit board 341, a second flexible printed circuit board 332, and a second rigid PCB 342 may be arranged in sequence. The second rigid PCB 342 may include an antenna connector and a universal serial bus (USB) connector, for example.

The second PCB 320 according to an embodiment of the present disclosure may have the electrical path 350 therein through which electrical signals can be transmitted. The electrical path 350 may be connected with the first PCB 310 through the FPCB 330 and the rigid PCB 340, which are integrated with each other.

The electrical path 350 according to an embodiment of the present disclosure may extend from a first electrical component 230 in FIG. 10 described below to a second electrical component 240 and may be disposed on or in the PCB 300 in FIG. 1. The electrical path 350 may be implemented as a transmission line of a side-guarded micro-strip-line type or a strip-line type, where the transmission line is shielded by a ground line 360 in order to transmit a high-frequency signal, which may be, for example, an RF signal.

The electrical path 350 according to an embodiment of the present disclosure, which is disposed on or in the second PCB 320, may receive a high-frequency signal through the connector 370 and may forward the received signal to antenna radiators 231 and 232 in FIG. 10 described below. Furthermore, a plurality of electrical paths 350 in FIG. 1 may be provided, and a ground line 360 may be disposed between the electrical paths 350 so that the electrical paths 350 can independently transmit the high-frequency signal without mutually affecting the characteristics thereof.

The ground line 360 according to an embodiment of the present disclosure may be disposed adjacent to the electrical path 350, and conductive vias 305 may be arranged in a portion of the area of a ground line 360(a). Accordingly, the electrical path 350 can pass through the PCB 300 without making contact with the conductive vias 305.

According to an embodiment of the present disclosure, the connector 370 for connecting the electrical path 350 may be disposed between the first and second PCBs 310 and 320 in order to transmit a high-frequency signal therebetween. The connector 370 may include a soldering pad, a zip-type connector, or a B-to-B-type connector. A rigid PCB may be employed for the connector 370, and, for example, a B-to-B-type connector may be mounted on the rigid printed circuit board, or a soldering pad may be located on the rigid PCB. Furthermore, for example, the pin map of a transmission line included in the connector 370 may be implemented in the sequence of a ground, an RF signal, and a ground.

Hereinafter, the plurality of layers and the conductive vias 305 of the PCB 300 is described in detail.

Figure 2:
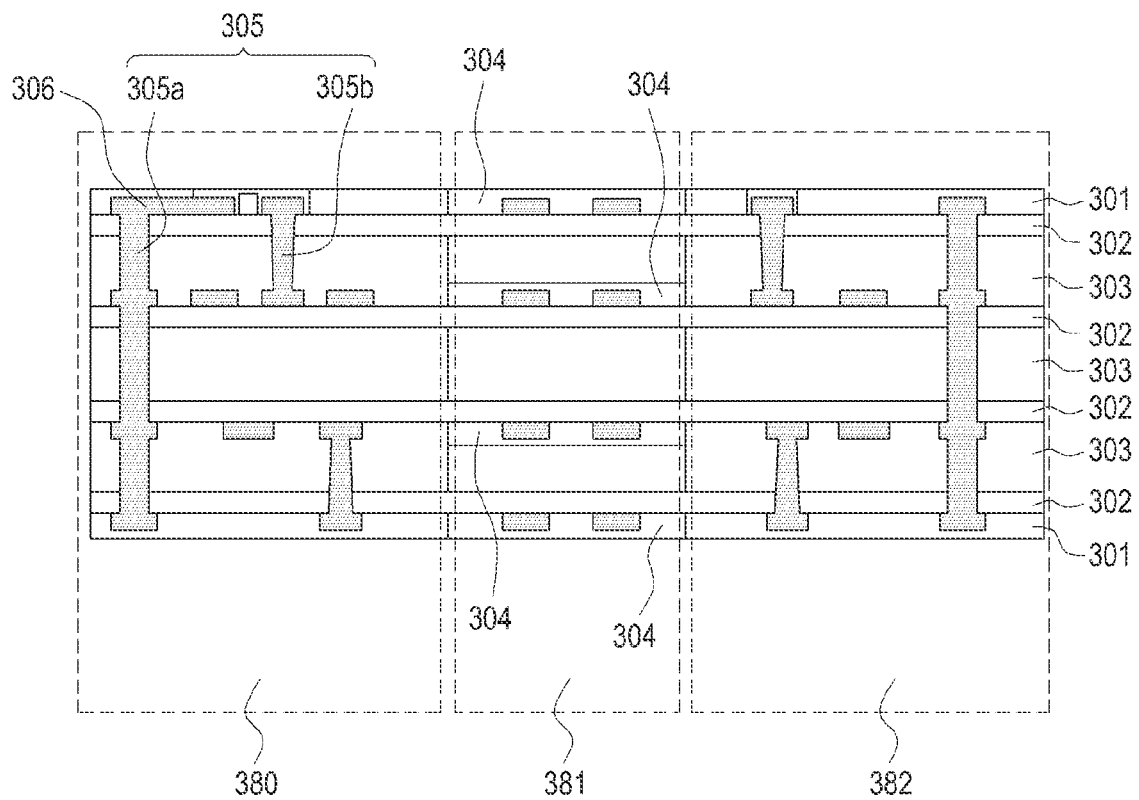
FIG. 2 is a partial sectional view of a plurality of layers of the PCB of FIG. 1, according to an embodiment of the present disclosure, where

FIG. 2 is a partial sectional view of the plurality of layers of the PCB of FIG. 1, according to an embodiment of the present disclosure, where FIG. 2 is taken along line B-B' of FIG. 1. Hereinafter, the PCB is described as the second PCB 320. However, the following description may be applied to second printed circuit boards 420, 520, 620, and 720 in other embodiments, which will be described below.

Referring to FIG. 2, the second printed circuit board 320 according to an embodiment of the present disclosure may be formed of a plurality of layers, each including at least one conductive layer 306, at least one first insulation layer 302, and at least one second insulation layer 303. The conductive layer 306 and the first insulation layer 302 may be included in a flexible copper clad laminated (FCCL) layer. Further, the first insulation layer 302 may include polyamide.

The conductive layers 306 according to an embodiment of the present disclosure are arranged in the stacking direction, and the first insulation layer 302 is disposed on the rear or front surface of each conductive layer 306. The individual layers may be alternately arranged. One or more conductive vias 305 may be formed to electrically connect the conductive layers 306.

According to an embodiment of the present disclosure, the second insulation layer 303 is provided between the conductive layers 306 to prevent the conductive layers 306 from being electrically connected together through contact therebetween. For example, the plurality of second insulation layers 303 disposed between the plurality of conductive layers 306 may function to insulate the layers and may include a resin and a glass fabric.

According to an embodiment of the present disclosure, a plurality of electronic components may be disposed on and electrically connected to the conductive layers 306. The electronic components may be electrically connected to the antenna radiators 231 and 232 in FIG. 10 described below provided in the electronic device. For example, the electronic components may include an antenna clip, a connector, and a switch device.

Without being limited thereto, however, various materials capable of passing electricity therethrough, other than metal, may be applied to the conductive layers 306 in FIG. 2.

According to an embodiment of the present disclosure, the conductive layers 306 may be electrically connected to any of a plurality of signal lines and ground lines.

The conductive layers 306 according to an embodiment of the present disclosure may be provided, on the top and bottom thereof, with a protective layer 301 capable of protecting the conductive layers 306. The protective layers 301 may be formed of an insulating coating material, such as solder resist, and, for example, a photo imageable solder resist ink (PSR ink) may be used for the solder resist. The PSR ink may be left on a product because it provides insulation and protection even after a component is mounted. Accordingly; the protective layers 301 coated on the exterior of the conductive layers 306 can prevent a short circuit, a connection, corrosion, and contamination of a circuit during a manufacturing process and can protect the conductive layers 306 from external shock, humidity, and chemical substances after the manufacturing process.

The conductive vias 305 according to an embodiment of the present disclosure, which electrically connect the conductive layers 306, may include a first conductive via 305(*a*) capable of electrically connecting all the layers and a second conductive via. 305(*b*) capable of electrically connecting adjacent layers. For example, the first conductive via 305(*a*) may be formed by computerized numerical control (CNC) hole machining and copper plating, and the second conductive via 305(*b*) may be formed by laser hole machining and copper plating.

The conductive vias 305 according to an embodiment of the present disclosure may include a region that forms a predetermined pattern within the PCB 300. The conductive vias 305 may be configured to make contact with at least one of the conductive layers 306 and to pass through at least one of the multiple layers.

A pattern cover layer 304 according to an embodiment of the present disclosure may be disposed in a single layer on the bottom or top of the conductive layers 306 while surrounding a pattern and thus can protect the internal pattern. For example, the pattern cover layer 304 may be formed of polyimide (PI) and an adhesive.

According to an embodiment of the present disclosure, rigid PCBs 380 and 382 and a FPCB 381 may be integrated with one another. The FPCB 381 may not include the second insulation layer 303, but may include the pattern cover layer 304 instead of the protective layer 301.

Figure 3:
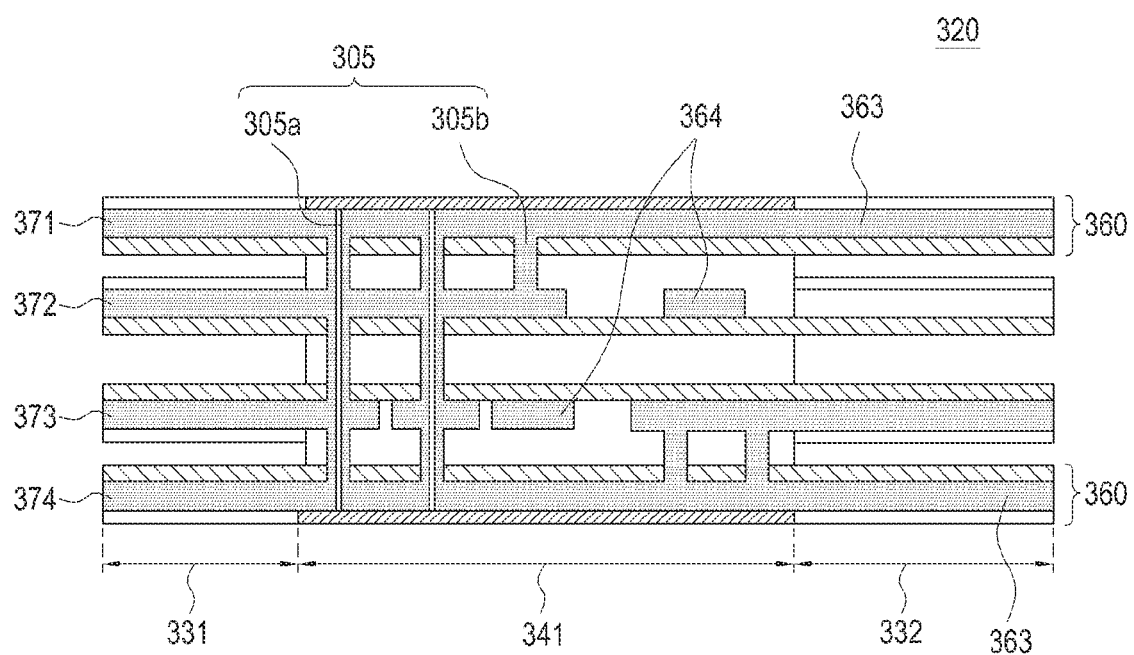
FIG. 3 is a sectional view of an interlayer configuration of a plurality of layers of the PCB of FIG. 1, according to an embodiment of the present disclosure, where

FIG. 3 is a sectional view of an interlayer configuration of a plurality of layers of the PCB of FIG. 1, according to an embodiment of the present disclosure, where FIG. 3 is taken along line B-B' of FIG. 1.

Referring to FIG. 3, the second PCB 320 may include the first FPCB 331, the first rigid PCB 341, and the second FPCB 332, which are integrally connected together.

Further, the second PCB 320 may include first to fourth ground pattern layers 371, 372, 373, and 374 that are connected by the conductive vias 305 in order to form a ground. The entirety of the first and second ground pattern layers 371 and 372 forms a ground. Only a part of the second and third ground pattern layers 372 and 373 forms a ground. According to an embodiment of the present disclosure, there may be a layer having no ground layer.

Signal line patterns 364 not connected to the ground may be provided. These signal line patterns 364 may be used as RF signal lines.

The ground pattern layers according to an embodiment of the present disclosure may be connected by the first conductive via 305(*a*) capable of electrically connecting all of the layers and the second conductive via 305(*b*) capable of electrically connecting adjacent layers. For example, all or some of the ground pattern layers may be connected using the first conductive via 305(*a*) passing through all of the layers. For example, the first to fourth ground pattern layers 371, 372, 373, and 374 may be connected by the first conductive via 305(*a*). The adjacent ground pattern layers may be connected to each other by the second conductive via 305(*b*). For example, the first and second ground pattern layers 371 and 372 may be connected to each other by the second conductive via 305(*b*).

According to an embodiment of the present disclosure, a PCB (for example, the PCB 300 of FIG. 1) may include the first PCB 310 and the second PCB 320 including a rigid PCB and a FPCB. In this case, the PCB is described as the PCB 300 of FIG. 1 as an example, but may be applied to the PCBs 400, 500, 600, and 700 of FIGS. 4, 5, 6A, 6B, 6C. 7A, 7B, and 7C.

According to an embodiment of the present disclosure, the high-frequency transmission line provided by the PCB in the electronic device may be configured such that the FPCB 330 having advantages of reducing a material cost and ensuring a mounting space can substitute for a coaxial cable.

For example, the first and second FPCBs 331 and 332 may be used between the second rigid PCB 342 and the first PCB 310 in order to transmit a high-frequency signal from the second rigid PCB 342 to the first PCB 310.

In another example, in order to eliminate loss that occurs when a high-frequency signal is transmitted using the FPCB 330, the first rigid PCB 341 may be disposed between the first and second FPCB 331 and 332, and the ground pattern layers may be connected by the conductive vias 305.

According to an embodiment of the present disclosure, in order to mitigate an increase in line loss, the electronic device may further include a section containing the first rigid PCB 341 in the middle of the FPCB 330. If the FPCB 330 has a length of 10 mm or more, the transmission line in the section may cause a great line loss. For example, the transmission line may have a change in the strip line characteristics due to the inductance generated by the ground lines 360 disposed on the opposite sides thereof, and thus the line loss generated by the electrical path 350 may increase markedly.

According to an embodiment of the present disclosure, the electronic device may have the one or more vias 305 arranged on the first rigid PCB 341. When the grounds are connected by the conductive vias 305 arranged on the first rigid PCB 341, the inductance generated by the ground lines 360 can be reduced, for example, by virtue of the interlayer ground connection on the ground lines 360, thereby reducing adverse effects, such as line loss. Furthermore, an all-ground layer (ground line) is disposed between the layers providing the second PCB 320, and the entire ground line 360 may be connected to the all-ground layer through the conductive vias 305, whereby it is possible to have a much greater line loss reduction effect.

According to an embodiment of the present disclosure, a rigid PCB may be disposed between the FPCBs, thereby preventing the layers from being separated or twisted as described above. In the case where the existing FPCBs are installed on a drive unit, the layers of the FPCBs may be separated or twisted. Even in this case, there may be a change in the characteristics of a strip line, which may cause line loss in the transmission line or other adverse property changes.

However, an electronic device having the aforementioned arrangement is advantageous in that the side effects mentioned above are not exhibited even when the FPCBs move, whereby it is possible to reduce line loss in the transmission line and to alleviate other adverse characteristics.

In addition, in the case where a transmission line has a greater length, it is possible to solve shortcomings, such as line loss, by additionally placing rigid PCBs in several positions on the FPCBs and using a connection between the ground line 360, other ground pattern layers 363, and the conductive vias 305. This is described below in greater detail with reference to FIG. 4.

Figure 4:
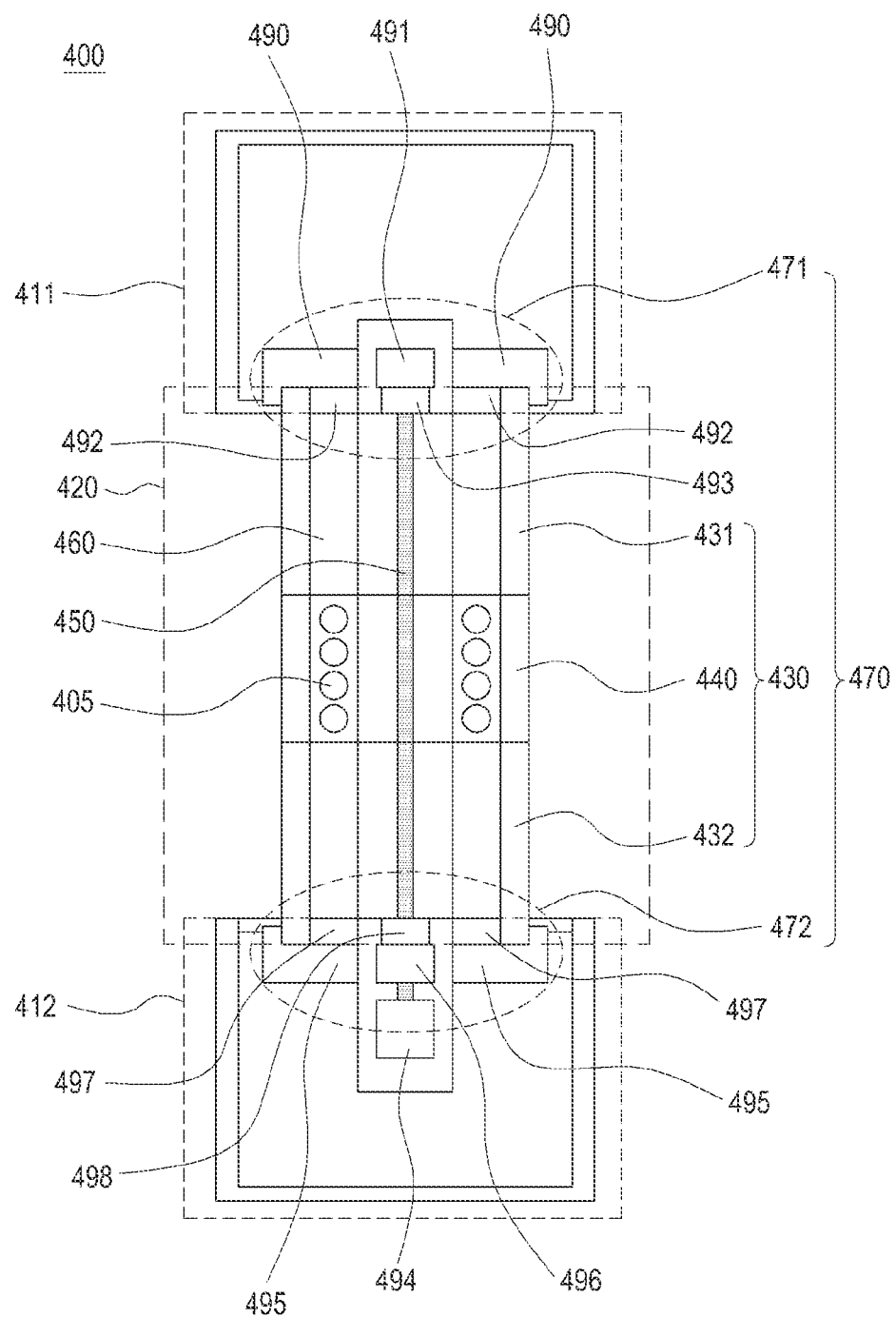
FIG. 4 is a front view of a high-frequency transmission line according to an embodiment of the present disclosure, where a PCB in an electronic device is used for the high-frequency transmission line.

FIG. 4 is a front view of a high-frequency transmission line according to an embodiment of the present disclosure, in which a PCB in an electronic device is used for the high-frequency transmission line, An electronic device may be a smart phone or a wearable device.

According to an embodiment of the present disclosure, an electronic device may include a housing corresponding to a case; a printed circuit unit including at least one PCB 400 in the housing; and an electrical path 450 passing aver or through the PCB 400.

Referring to FIG. 4, the PCB 400 according to an embodiment of the present disclosure may include a second PCB 420, a third PCB 411, and a fourth PCB 412. For example, the third PCB 411 may be a main board on which electronic components included in an electronic device are mounted, the main board being capable of transmitting signals between the electronic components. Furthermore, for example, the fourth PCB 412 may be a main board on which electronic components included in an electronic device are mounted, the main board being capable of transmitting signals between the electronic components. Moreover, for example, the second PCB 420 may be a sub-board that transmits signals generated by electronic components. The sub-board may further include the electronic components.

The PCB 400 according to an embodiment of the present disclosure may be provided with a circuit of a terminal, which may be, for example, at least one of an AP, a CP, a memory, and an RF transceiver, and may include a signal line (for example, an RF signal line).

The second to fourth PCBs 420, 411, and 112 according to an embodiment of the present disclosure may be formed of a plurality of layers, and the plurality of layers may include one or more conductive layers and one or more insulation layers.

The third and fourth PCBs 411 and 412 according to an embodiment of the present disclosure may be a rigid PCB.

The third or fourth PCB 411 and 412 may be electrically connected to the second PCB 410 through a connector 470.

The third PCB 411 may be disposed on one end of the second PCB 420, and the fourth PCB 412 may be disposed on an opposite end of the second PCB 420. Hereinafter, the third and fourth printed circuit boards 411 and 412 are described as third and fourth rigid PCBs 411 and 412, respectively.

The third rigid PCB 411 according to an embodiment of the present disclosure may be connected with the second. PCB 420, and a first connector 471 may be disposed to transmit a high-frequency signal through the electrical path 450. The first connector 471 may include a soldering pad, a zip-type connector, or a B-to-B-type connector. A rigid PCB may be employed for the first connector 471, and, for example, a B-to-B-type connector may be mounted on the rigid PCB, or a soldering pad may be located on the rigid PCB. Furthermore, for example, the pin map of a transmission line included in the first connector 471 may be implemented in the sequence of a ground, an RF signal, and a ground.

The first connector 471 according to an embodiment of the present disclosure may include a ground pad 490 and a signal pad 491 of the third rigid. PCB 411 and a ground pad 492 and a signal pad 493 of the second PCB 420. The ground pad 490 of the third rigid PCB 411 and the ground pad 492 of the second PCB 420 may be connected together by soldering. The signal pad 491 of the third rigid PCB 411 and the signal pad 493 of the second PCB 420 may be connected by soldering.

The fourth rigid PCB 412 according to an embodiment of the present disclosure may be connected to the second PCB 420, and a second connector 472 may be disposed to transmit a high-frequency signal through the electrical path 450. The second connector 472 may include a soldering pad, a zip-type connector, or a B-to-B-type connector. A rigid PCB may be employed for the second connector 472, and, for example, a B-to-B-type connector may be mounted on the rigid PCB, or a soldering pad may be located on the rigid PCB. Furthermore, for example, the pin map of a transmission line included in the first connector 472 may be implemented in the sequence of a ground, an RF signal, and a ground.

The second connector 472 according to an embodiment of the present disclosure may include a ground pad 495 and a signal pad 496 of the fourth rigid PCB 412 and a ground pad 497 and a signal pad 498 of the second PCB 420. The ground pad 495 of the fourth rigid PCB 412 and the ground pad 497 of the second PCB 420 may be connected by soldering. The signal pad 496 of the fourth rigid PCB 412 and the signal pad 498 of the second PCB 420 may be connected by soldering. The second PCB 420 may include an interconnection pad 494. An antenna contact member (for example, a C-clip) or an RF component (for example, a matching circuit) may be mounted on the interconnection pad 494.

The second PCB 420 according to an embodiment of the present disclosure may be disposed between the third rigid PCB 411 and the fourth rigid PCB 412, and may include an FPCB 430 or a rigid PCB 440. The flexible printed circuit board 430 and the rigid PCB 440 of the second PCB 420 may be integrated with each other. For example, a first FPCB 431, the first rigid PCB 440, and a second flexible PCB 432 may be arranged in sequence. The first rigid PCB 440 may include an antenna connector and a USB connector, for example.

The electrical path 450 according to an embodiment of the present disclosure may extend from a first electrical component including an antenna radiator to a second electrical component including a communication circuit, and may be disposed on or in the PCB 400. The electrical path 450 may be implemented to be a transmission line of a side-guarded micro-strip-line type or a strip-line type, the transmission line being shielded by a ground line in order to transmit a high-frequency signal, which may be, for example, an RF signal.

The electrical path 450 according to an embodiment of the present disclosure, which is disposed on or in the second PCB 420, may receive a high-frequency signal through the connector 470 and may forward the received signal to antenna radiators 231 and 232 in FIG. 10 described below. Furthermore, a plurality of electrical paths 450 in FIG. 4 may be provided, and a ground line 460 may be disposed between the electrical paths 450 so that the electrical paths 450 can independently transmit a high-frequency signal without mutually affecting the characteristics thereof.

The ground line 460 according to an embodiment of the present disclosure may be disposed adjacent to the electrical path 450, and conductive vias 405 may be arranged in a portion of the area of the ground line 460. Accordingly, the electrical path 450 can pass through the PCB 400 without making contact with the conductive vias 405.

A plurality of layers of the PCB 400 and the conductive vias 405 are the same as those in the above-described embodiment with reference to FIGS. 1 to 3, and therefore descriptions thereof are omitted here.

Figure 5:
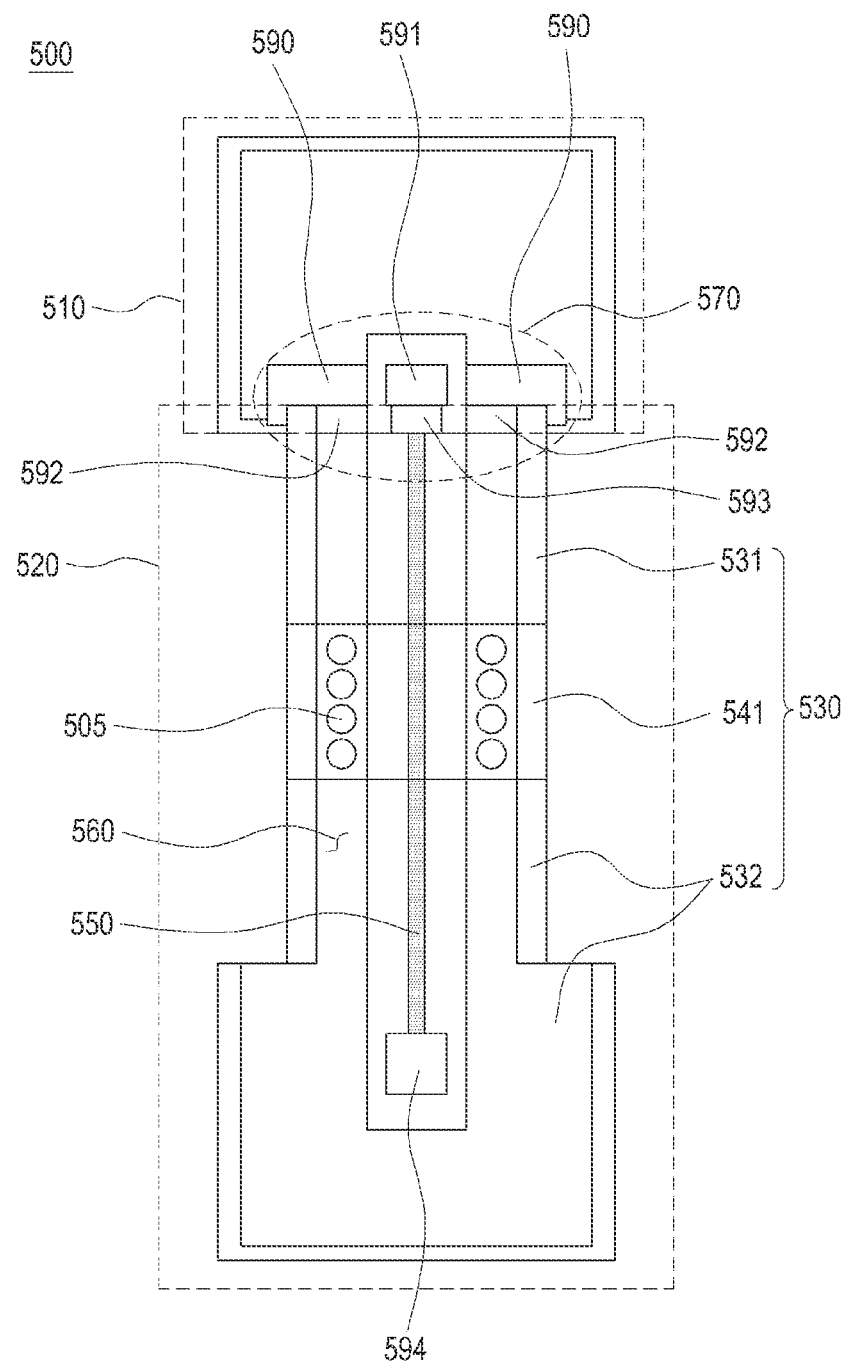
FIG. 5 is a front view of a high-frequency transmission line according to an embodiment of the present disclosure, where a PCB in an electronic device is used for the high-frequency transmission line.

FIG. 5 is a front view of a high-frequency transmission line according to an embodiment of the present disclosure, where a PCB in an electronic device is used for the high-frequency transmission line. The electronic device may be a smart phone or a wearable device.

Referring to FIG. 5, an electronic device may include a housing corresponding to a case; a printed circuit unit including at least one PCB 500 in the housing; and an electrical path 550 passing over or through the PCB 500.

The PCB 500 according to an embodiment of the present disclosure may include a first PCB 510 and a second PCB 520. For example, the first PCB 510 may be a main board on which electronic components included in an electronic device are mounted, the main board being capable of transmitting signals between the electronic components, and the second PCB 520 may be a sub-board on which the electronic components are mounted, the sub-board being capable of transmitting signals generated by the electronic components. The sub-board may further include the electronic components.

The PCB 500 according to an embodiment of the present disclosure may be provided with a circuit of a terminal, which may be, for example, at least one of an AP, a CP, a memory and an RF transceiver, and may include a signal line (for example, an RF signal line).

The first and second PCBs 510 and 520 according to an embodiment of the present disclosure may be formed of a plurality of layers, and the plurality of layers may include one or more conductive layers and one or more insulation layers.

The first PCB 510 according to an embodiment of the present disclosure may be a rigid PCB. The first PCB 520 may be electrically connected to the second PCB 510 through a connection unit 570. The first PCB 510 may be connected to the second PCB 520, and the connector 570 may be disposed to transmit a high-frequency signal through the electrical path 550. The connector 570 may include a soldering pad, a zip-type connector, or a B-to-B-type connector. A rigid PCB may be employed for the connector 570, and, for example, a B-to-B-type connector may be mounted on the rigid PCB, or a soldering pad may be located on the rigid PCB.

The connector 570 according to an embodiment of the present disclosure may include a ground pad 590 and a signal pad 591 of the first PCB 510 and a ground pad 592 and a signal pad 593 of the second PCB 520. The ground pad 590 of the first PCB 510 and the ground pad 592 of the second PCB 520 may be connected by soldering. The signal pad 591 of the first PCB 510 and the signal pad 593 of the second PCB 520 may be connected together by soldering. The second PCB 520 may include an interconnection pad 594. An antenna contact member (for example, a C-clip) or an RF component (for example, a matching circuit) may be mounted on the interconnection pad 594.

The second PCB 520 according to an embodiment of the present disclosure may include an FPCB 530 and a rigid PCB 510 that are integrated with each other. For example, the second PCB 520 may include a first FPCB 531, a first rigid PCB 541, and a second FPCB 532, which are arranged in sequence. The second FPCB 532 may include an antenna connector and a USB connector. Unlike in an embodiment described above with reference to FIG. 1, the second FPCB 532 in FIG. 5 is configured to perform the function of the second rigid PCB 342 in FIG. 1 as well.

The electrical path 550 in FIG. 5 according to an embodiment of the present disclosure may extend from a first electrical component including an antenna radiator to a second electrical component including a communication circuit, and may be disposed on or in the PCB 500. The electrical path 550 may be implemented to be a transmission line of a side-guarded micro-strip-line type or a strip-line type, the transmission line being shielded by a ground line in order to transmit a high-frequency signal, which may be, for example, an RF signal.

The electrical path 550 according to an embodiment of the present disclosure, which is disposed on or in the second PCB 520, may receive a high-frequency signal through the connector 570 and may forward the received signal to an antenna radiator. Furthermore, a plurality of electrical paths 550 may be provided, and a ground line 560 may be disposed between the electrical paths 550 so that the electrical paths 550 can independently transmit the high-frequency signal without mutually affecting the characteristics thereof.

The ground line 560 according to an embodiment of the present disclosure may be disposed adjacent to the electrical path 550, and conductive vias 505 may be arranged in a portion of the area of the ground line 560. Accordingly, the electrical path 550 can pass through the PCB 500 without making contact with the conductive vias 505.

A plurality of layers of the PCB 500 and the conductive vias 505 are the same as those in an above-described embodiment with reference to FIGS. 1 to 3, and therefore descriptions thereof are omitted here.

Figure 6A:
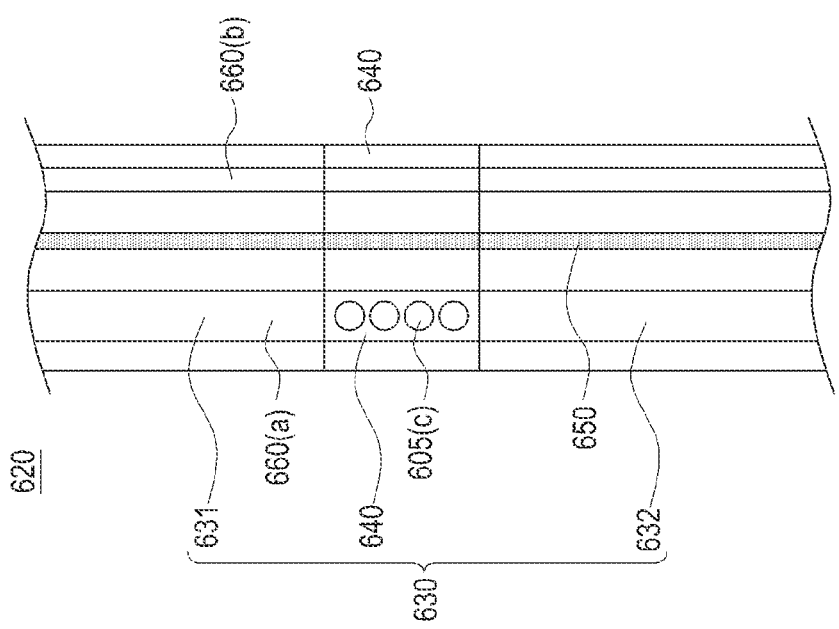
Figure 6B:
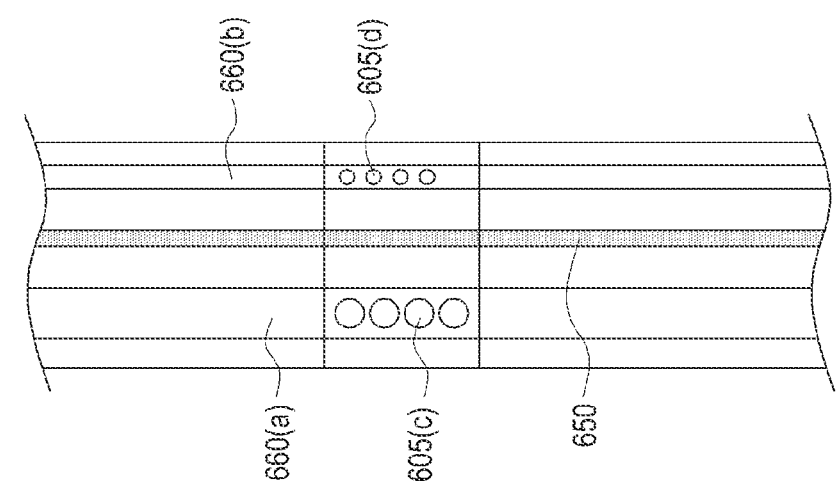
Figure 6C:
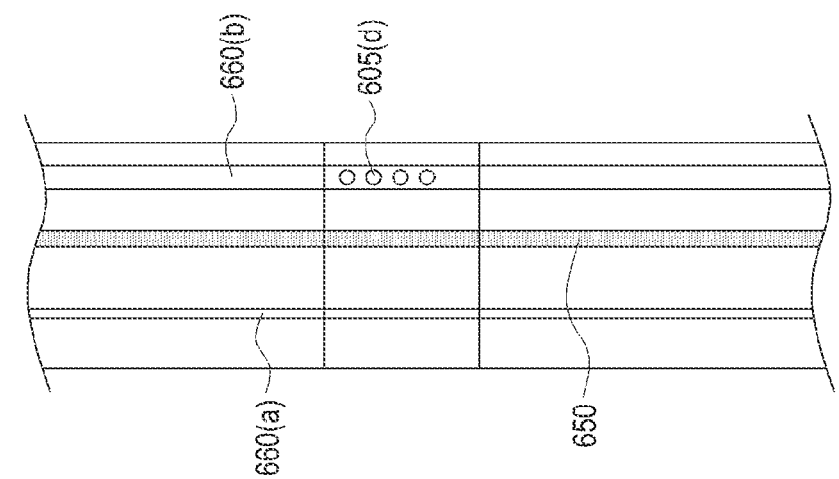

FIGS. 6A, 6B, and 6C are front views of conductive vias according to an embodiment of the present disclosure, the conductive vias being arranged in electronic device PCBs. FIGS. 6A, 6B, and 6C illustrate various forms of PCBs.

Referring to FIG. 6A, a second PCB 620 according to an embodiment of the present disclosure may include an FPCB 630 and a rigid PCB 640, which are integrated with each other. For example, the second PCB 620 may include a first FPCB 631, the first rigid PCB 640, and a second FPCB 632, which are arranged in sequence.

An electrical path 650 according to an embodiment of the present disclosure may be disposed on or in the second PCB 620 and may be implemented to be a transmission line of a side-guarded micro-strip-line type or a strip-line type in order to transmit a high-frequency signal.

The electrical path 650 according to an embodiment of the present disclosure, which is disposed on or in the second PCB 620, may receive a high-frequency signal through a connector and may forward the received signal to an antenna radiator. Furthermore, a plurality of electrical paths 650 may be provided, and a ground line 660 may be disposed between the electrical paths 650 so that the electrical paths 650 can independently transmit the high-frequency signal without mutually affecting the characteristics thereof.

The ground lines 660 according to an embodiment of the present disclosure may be disposed adjacent to the electrical path 650 and may be connected with one or more conductive layers through conductive vias 605(c) in the PCB. Since the conductive vias 605(c) are arranged in one ground line 660, the electrical path 650 may pass through the PCB without making contact with the conductive vias 605(c).

The electrical path 650 according to an embodiment of the present disclosure is disposed to pass through the flexible PCB 630 and the rigid PCB 640, and thus the ground lines 660 disposed on opposite sides of the electrical path 650 may also be disposed to pass through the FPCB 630 and the rigid PCB 640. While two ground lines 660 are provided in FIG. 6A, the number of ground lines 660 may be diversely varied so as to avoid contact with the electrical path 650, without being limited thereto.

For example, the first ground line 660(a) disposed on the left side may have a greater width than the second ground line 660(b) disposed on the right side, and the plurality of conductive vias 605(c) may be formed in the region where the rigid PCB 640 and the ground line 660(a) cross each other. The second ground line 660(b) may not include the conductive vias 605(c) since the second ground line 660(b) has a lesser width than the first ground line 660(a).

The PCB is illustrated as having the conductive vias 605(c) arranged in the first ground line 660(a) having a great width. The conductive vias 605(c) arranged in the first ground line 660(a) may include vias passing through all layers. Ground patterns in all or some of the layers and the ground line on a side of the electrical path may be connected by the conductive vias 605(c) passing through all the layers.

Referring to FIG. 6B, ground lines 660 may be separately disposed on opposite sides of an electrical path 650 in the second PCB 620 and may be formed to pass through the flexible PCB and the rigid PCB along the lengthwise direction of the electrical path 650. While the two ground lines 660 are provided in FIG. 6B, the number of ground lines 660 may be diversely varied so as to avoid contact with the electrical path 650, without being limited thereto.

According to an embodiment of the present disclosure, the first ground line 660(a) disposed on the left side may have a greater width than the second ground line 660(b) disposed on the right side, and a plurality of conductive vias 605(c) may be formed in the region where the first ground line 660(a) and the rigid PCB 640 cross each other. The second ground line 660(b) on the right side may not include the conductive vias 605(c) having the size since the second ground line 660(b) has a lesser width than the first ground line 660(a). Instead, the second ground line 660(b) on the right side may have conductive vias 605(d) having a lesser size than the conductive vias 605(c).

For example, the rigid PCB 640 formed of a plurality of layers may include the third conductive vias 605(c) passing through all of the layers in the PCB and the fourth conductive vias 605(d) passing through some of the layers. The third conductive vias 605(c) may have a greater hole size than the fourth conductive vias 605(d) passing through some of the layers, and may be arranged in the ground line 660(a) having a great width. However, the fourth conductive vias 605(d) may be arranged in the second ground line 660(b) having a lesser width and disposed on the right side, since the fourth conductive vias 605(d) have a lesser hole size than the third conductive vias 605(c). Even when the ground lines 660 are connected with a ground in a different layer through some conductive vias 605, it is possible to reduce line loss.

Referring to FIG. 6C, ground lines 660 may be separately disposed on opposite sides of an electrical path 650 and may be formed in the lengthwise direction of the electrical path 650. While two ground lines 660 are provided in FIG. 6C, the number of ground lines 660 may be diversely varied so as to avoid contact with the electrical path 650, without being limited thereto.

According to an embodiment of the present disclosure, the first ground line 660(a) disposed on the left side may have a lesser width than the second ground line 660(b) disposed on the right side, and a plurality of conductive vias 605(d) may be formed in the region where the second ground line 660(b) and the rigid PCB 640 cross each other. The second ground line 660(b) on the right side has a greater width than the first ground line 660(a), but is too narrow to have the great conductive vias 605(c). Instead, the conductive vias 605(d) having a lesser width may be arranged in the second ground line 660(b) on the right side.

Therefore, according to an embodiment of the present disclosure, the second ground line 660(b) having a lesser width and disposed on the right side may electrically connect the PCB using the fourth conductive vias 605(d) passing through some layers. Even when the ground lines 660 are connected with a ground in a different layer through some of the fourth conductive vias 605(d), it is possible to reduce line loss.

FIGS. 7A, 7B, and 7C are top views illustrating conductive vias arranged in PCBs according to an embodiment of the present disclosure. FIGS. 7A, 7B, and 7C illustrate various forms of PCBs.

Referring to FIG. 7A, a second PCB 720 may include a plurality of FPCBs and/or a plurality of rigid PCBs. For example, the second PCB 720 may be configured such that FPCBs 730 and rigid PCBs 740 are alternately disposed and are integrated with each other.

The FPCBs 730 according to an embodiment of the present disclosure may include a first FPCB 731, a second FPCB 732, and a third FPCB 733. The rigid PCBs 740 may include a first rigid PCB 741 and a fifth rigid PCB 742.

According to an embodiment of the present disclosure, at least two rigid PCBs 740 may be provided between the FPCBs 730. For example, the second PCB 720 may include the first FPCB 731, the first rigid PCB 741, the second FPCB 732, the fifth rigid PCB 742, and the third FPCB 733, which are arranged in sequence.

The first and fifth rigid PCBs 741 and 742 may be disposed to be spaced apart from each other and may include a plurality of conductive vias 705(c) and ground lines 760.

An electrical path 750 according to an embodiment of the present disclosure may be disposed on or in the second PCB 720 and may be implemented to be a transmission line of a side-guarded micro-strip-line type or a strip-line type in order to transmit a high-frequency signal.

The electrical path 750 according to an embodiment of the present disclosure, which is disposed on or in the second PCB 720, may receive a high-frequency signal through a connector and may forward the received signal to an antenna radiator. Furthermore, a plurality of electrical paths 750 may be provided, and the ground line 760 may be disposed between the electrical paths 750 so that the electrical paths 750 can independently transmit the high-frequency signal without mutually affecting the characteristics thereof.

The ground lines 760 according to an embodiment of the present disclosure may be disposed adjacent to the electrical path 750 and may be connected with one or more conductive layers through the conductive vias 705(c) in the PCB 720.

The ground lines 760 according to an embodiment of the present disclosure may be formed to pass through the FPCB 730 and the rigid PCBs 740 along the lengthwise direction of the electrical path 750. While two ground lines 760 are provided in the present disclosure, the number of ground lines 760 may be diversely varied so as to avoid contact with the electrical path 750, without being limited thereto.

For example, the first ground line 760(a) disposed on the left side of the first and fifth rigid PCBs 741 and 742 may have a greater width than the second ground line 760(b) disposed on the right side, and the plurality of conductive vias 705(c) may be formed in the regions where the first ground line 760(a) crosses the first and fifth rigid PCBs 741 and 742. In another example, the second ground line 760(b) on the right side may not include the conductive vias 705(c) having the size since the second ground line 760(b) has a lesser width than the first ground line 760(a). The PCB is illustrated as having the conductive vias 705(c) arranged in the first ground line 760(a) having a great width.

Referring to FIG. 7B, the second PCB 720 may include the FPCBs 730 and the rigid PCBs 740 that are integrated with each other. For example, the second PCB 720 may be configured such that the FPCBs 730 and the rigid PCBs 740 are alternately disposed and are integrated with each other.

The second PCB 720 according to an embodiment of the present disclosure may include the first FPCB 731, the first rigid PCB 741, the second. FPCB 732, the fifth rigid PCB 742, and the third FPCB 733, which are arranged in sequence.

Ground lines 760 according to an embodiment of the present disclosure may be separately disposed on opposite sides of the electrical path 750 and may be formed along the lengthwise direction of the electrical path 750. While two ground lines 760 are provided in the FIG. 7B, the number of ground lines 760 may be diversely varied so as to avoid contact with the electrical path 750, without being limited thereto.

According to an embodiment of the present disclosure, the first ground line 760(a) disposed on the left side of the first and fifth rigid PCBs 741 and 742 may have a greater width than the second ground line 760(b) disposed on the right side, and a plurality of conductive vias 705(c) may be formed in the regions where the first ground line 760(a) crosses the rigid PCBs 740. However, the second ground line 760(b) on the right side may not include the conductive vias 705(c) having the size since the second ground line 760(b) has a lesser width than the first ground line 760(a). Instead, the second ground 760(b) on the right side may have conductive vias 705(d) having a lesser size than the conductive vias 705(c).

For example, the rigid PCBs 740 formed of a plurality of layers may include the third conductive vias 705(c) passing through all the layers in the PCB and the fourth conductive vias 705(d) passing through some of the layers. The third conductive vias 705(c) may have a greater hole size than the fourth conductive vias 705(d) passing through some of the layers, and may be arranged in the ground line 760(a) having a great width. However, the fourth conductive vias 705(d) may be arranged in the second ground line 760(b) having a lesser width and disposed on the right side, since the fourth conductive vias 705(d) have a lesser hole size than the third conductive vias 705(c). Even when the ground lines 760 are connected with a ground in a different layer through some conductive vias 705, it is possible to reduce a line loss.

Referring to FIG. 7C, the second PCB 720 may include the FPCBs 730 and the rigid PCBs 740 that are alternately disposed and are integrated with each other. In this embodiment, at least two rigid PCBs 740 may be provided between the FPCBs 730. For example, the second PCB 720 may include the first FPCB 731, the second. FPCB 732, the first rigid PCB 741, the fifth rigid PCB 742, and the third FPCB 733, which are arranged in sequence.

Ground lines 760 according to an embodiment of the present disclosure may be separately disposed on opposite sides of the electrical path 750 and may be formed along the lengthwise direction of the electrical path 750. While two ground lines 760 are provided in the present disclosure, the number of ground lines 760 may be diversely varied so as to avoid contact with the electrical path 750, without being limited thereto.

According to an embodiment of the present disclosure, the first ground line 760(a) disposed on the left side of the first and fifth rigid PCBs 741 and 742 may have a lesser width than the second ground line 760(b) disposed on the right side, and a plurality of conductive vias 705(d) may be formed in the regions where the second ground line 760(b) crosses the rigid PCBs 740. The second ground line 760(b) on the right side has a greater width than the first ground line 760(a), but is too narrow to have the great conductive vias 705(c). Instead, the conductive vias 705(d) having a lesser width may be arranged in the second ground line 760(b) on the right side.

Therefore, according to an embodiment of the present disclosure, even when the ground lines 760 are connected to a ground in a different layer through some of the fourth conductive vias 705(d) arranged in the second ground line 760(b), it is possible to reduce a line loss.

Figure 8:
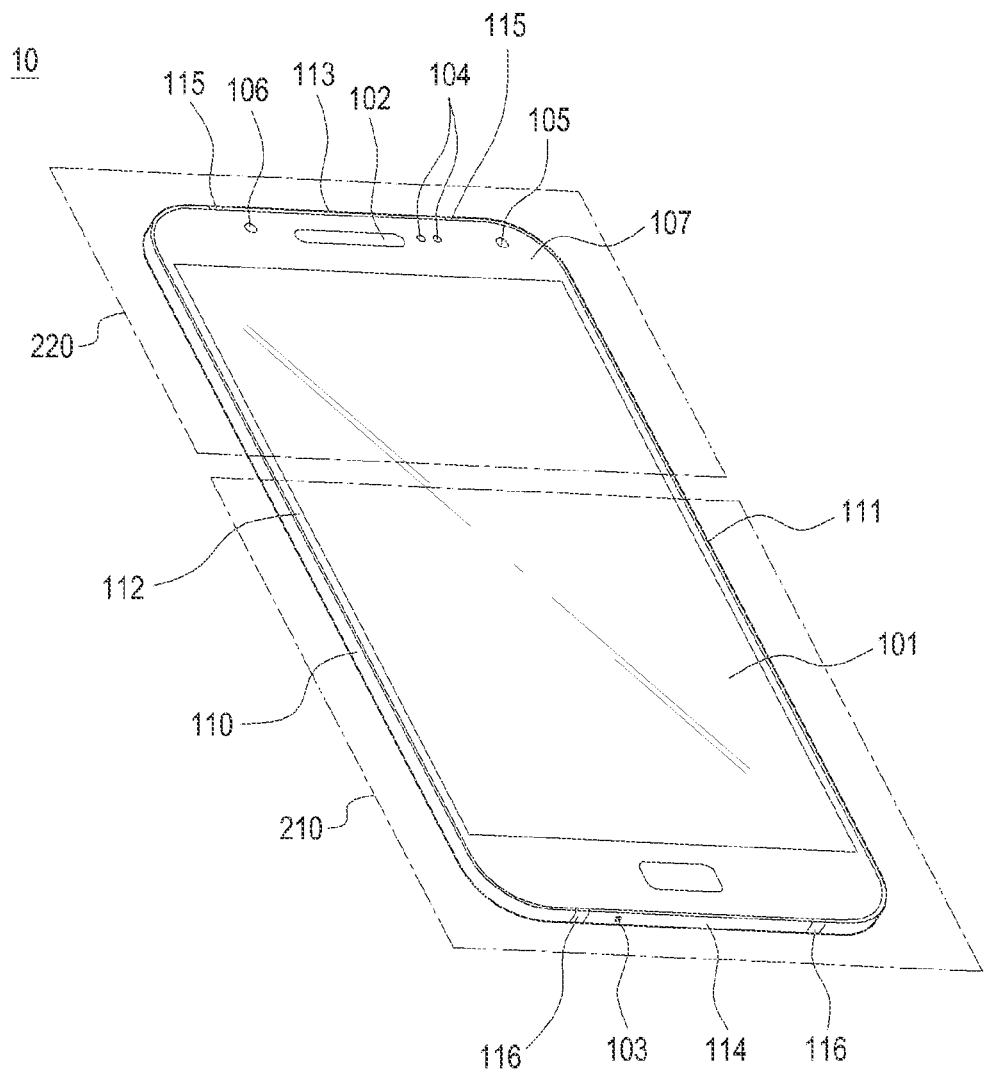
FIG. 8 is a perspective view of an electronic device according to an embodiment of the present disclosure.

FIG. 8 is a perspective view of an electronic device according to an embodiment of the present disclosure. The electronic device 10 may be a smart phone or a wearable device. The electronic device 10 may be an electronic device that includes the PCBs described above with reference to FIGS. 1 to 7.

Referring to FIG. 8, a display 101 may be mounted on the front 107 of the electronic device 10. A speaker device 102 for receiving a counterpart's speech may be provided on the upper side of the display 101. A microphone device 103 for transmitting the speech of a user of the electronic device 10 to the counterpart may be provided on the lower side of the display 101.

According to an embodiment of the present disclosure, one or more components for performing various functions of the electronic device 10 may be arranged around the speaker device 102. For example, the one or more arranged components may include at least one sensor module 104. The sensor module 101 may include, for example, at least one of an illuminance sensor (e.g., an optical sensor), a proximity sensor, an infrared sensor, and an ultrasonic sensor. The components may also include a camera device 105. The components may also include a light emitting diode (LED) indicator 106 for informing a user of status information of the electronic device 10.

According to an embodiment of the present disclosure, the electronic device 10 may include a metal bezel 110 (for example, capable of serving as at least a part of a metal housing). The metal bezel 110 may be disposed along the outer periphery of the electronic device 10 and may extend to at least one area of the back of the electronic device 10, the at least one area being connected to the outer periphery. The metal bezel 110 may define the thickness of the electronic device 10 along the outer periphery of the electronic device 10 and may be formed in a loop shape. Without being limited thereto, however, the metal bezel 110 may also be formed in such a manner that the metal bezel contributes to at least part of the thickness of the electronic device 10. The metal bezel 110 may also be disposed only in at least one area of the outer periphery of the electronic device 10. The metal bezel 110 may include one or more cut-off portions 115 and 116. Unit bezel parts separated by the cut-off portions 115 and 116 may be used as an antenna radiator that operates in at least one frequency band.

According to an embodiment of the present disclosure, the metal bezel 110 may have a loop shape along the outer periphery of the electronic device and may be disposed to contribute to the entirety or a part of the thickness of the electronic device 10. When the electronic device 10 is viewed from the front, the metal bezel 110 may include a right bezel part 111, a left bezel part 112, an upper bezel part 113, and a lower bezel part 114. In this case, the lower bezel part 114 described above may serve as a unit bezel part formed by a pair of cut-off portions 116.

According to an embodiment of the present disclosure, a main antenna device may be disposed in the lower region (an antenna region of a main part) of the electronic device 10. The lower bezel part 114 may be used as a main antenna radiator by virtue of the pair of cut-off portions 116. The lower bezel part 114 may serve as an antenna radiator that operates in at least two operating frequency bands depending on the feeding position. For example, the lower bezel part 114 may be a part of an antenna that supports a low band (LB) and a high/middle band (H/MB), or a part of an antenna that supports an H/MB.

According to an embodiment of the present disclosure, the antenna device of the present disclosure is simply for illustrative purpose, and the aforementioned functions of the lower bezel part 114 may be performed by the upper bezel part 113 separated by the other cut-off portions 115, or may be performed by the upper and lower bezel parts.

According to an embodiment of the present disclosure, an antenna region of a diversity part may be used as an antenna for diversity/multiple input multiple output (MIMO). For example, the upper bezel part 113 may be a part of a diversity antenna that supports LB and H/MB.

According to an embodiment of the present disclosure, at least one of the right and left bezel parts 111 and 112 may be supplied with electrical power to operate as an antenna. For example, the right or left bezel part 111 or 112 may be a part of an antenna that supports an H/MB band or LB and H/MB bands. For example, an antenna including the right or left bezel part 111 or 112 included in the antenna region of the main part may operate as a main antenna. An antenna including the right or left bezel part 111 or 112 included in the antenna region of the diversity part may operate as a diversity antenna. Hereinafter, the configuration of an antenna is described in detail.

Figure 9:
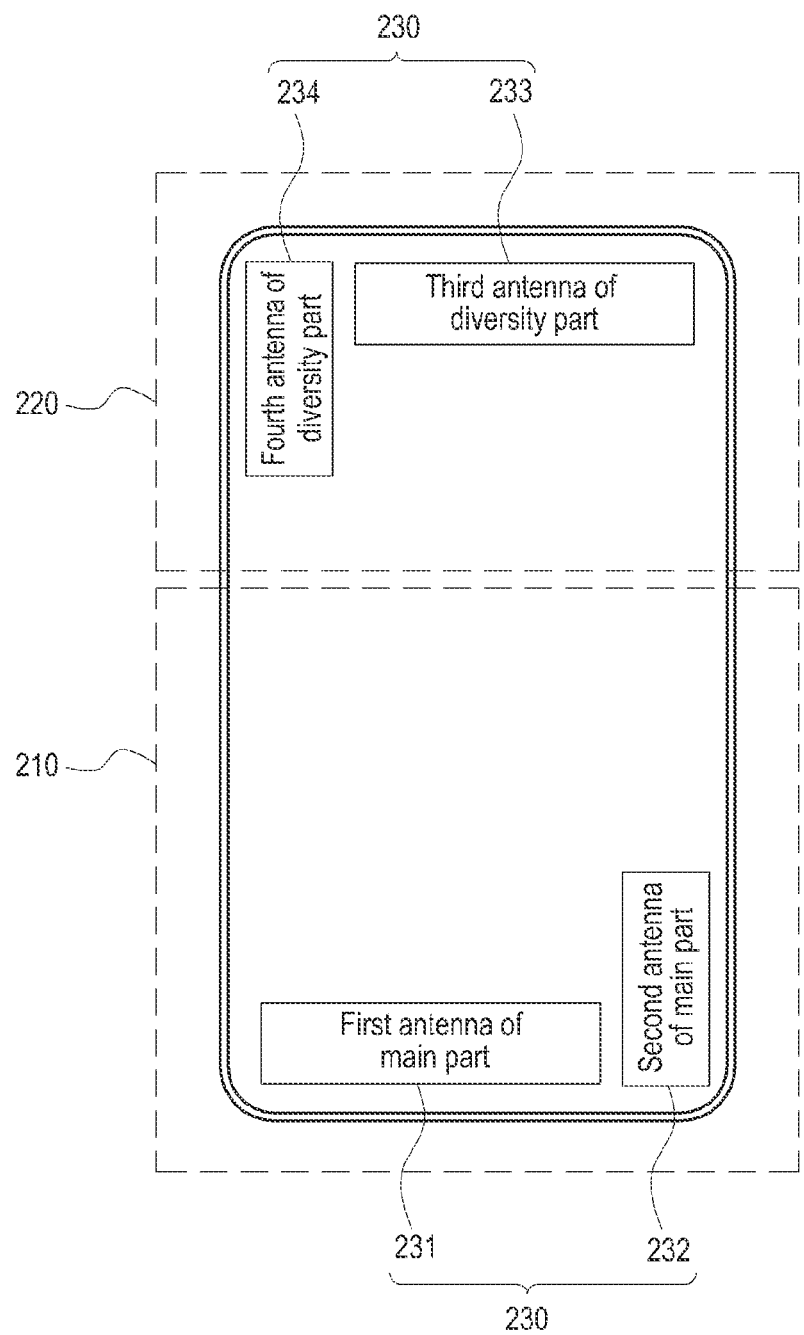
FIG. 9 is a schematic of an antenna arrangement in an electronic device according to an embodiment of the present disclosure.

FIG. 9 is a schematic of an antenna arrangement in an electronic device 10 according to an embodiment of the present disclosure. The electronic device 10 may be a smart phone or a wearable device. The electronic device 10 may be an electronic device that includes the PCBs described above with reference to FIGS. 1 to 7.

The electronic device 10 according to an embodiment of the present disclosure may include a plurality of antenna radiators 230. For example, the electronic device 10 may include first and second antennas 231 and 232 of a main part 210 and third and fourth antennas 233 and 234 of a diversity part 220.

The first antenna 231 may support LB and H/MB bands, and the second antenna 232 may support an H/MB band. According to an embodiment of the present disclosure, an LB band has a relatively great wavelength so that an antenna may have a relatively great size, and there may be a mounting space limitation by adding an antenna supporting multiple LBs to the main part 210 of the terminal. Therefore, only one antenna may be configured to support an LB band.

In the case where the electronic device 10 additionally has the diversity part 220 according to an embodiment of the present disclosure, the electronic device 10 may include the third and fourth antennas 233 and 234. In order to enhance correlation/isolation characteristics, the antenna radiators 230 of the main part 210 may be included in the lower end portion of the terminal, and the antenna radiators 230 of the diversity part 220 may be included in the upper end portion of the terminal. For example, in the case where the antenna radiators 230 of the main part 210 are included in the lower end portion of the terminal, and the antenna radiators 230 of the diversity part 220 are included in the upper end portion of the terminal, it is possible to ensure an antenna separation distance available in the terminal even when a plurality of LB band antennas are included.

By virtue of the structure described above, the electronic device 10 can receive signals using four antennas in an H/MB band and can receive signals using two antennas in an LB band. That is, 4th order diversity/MIMO can be performed in an H/MB band, and 2nd order diversity/MIMO can be performed in an LB band.

Figure 10:
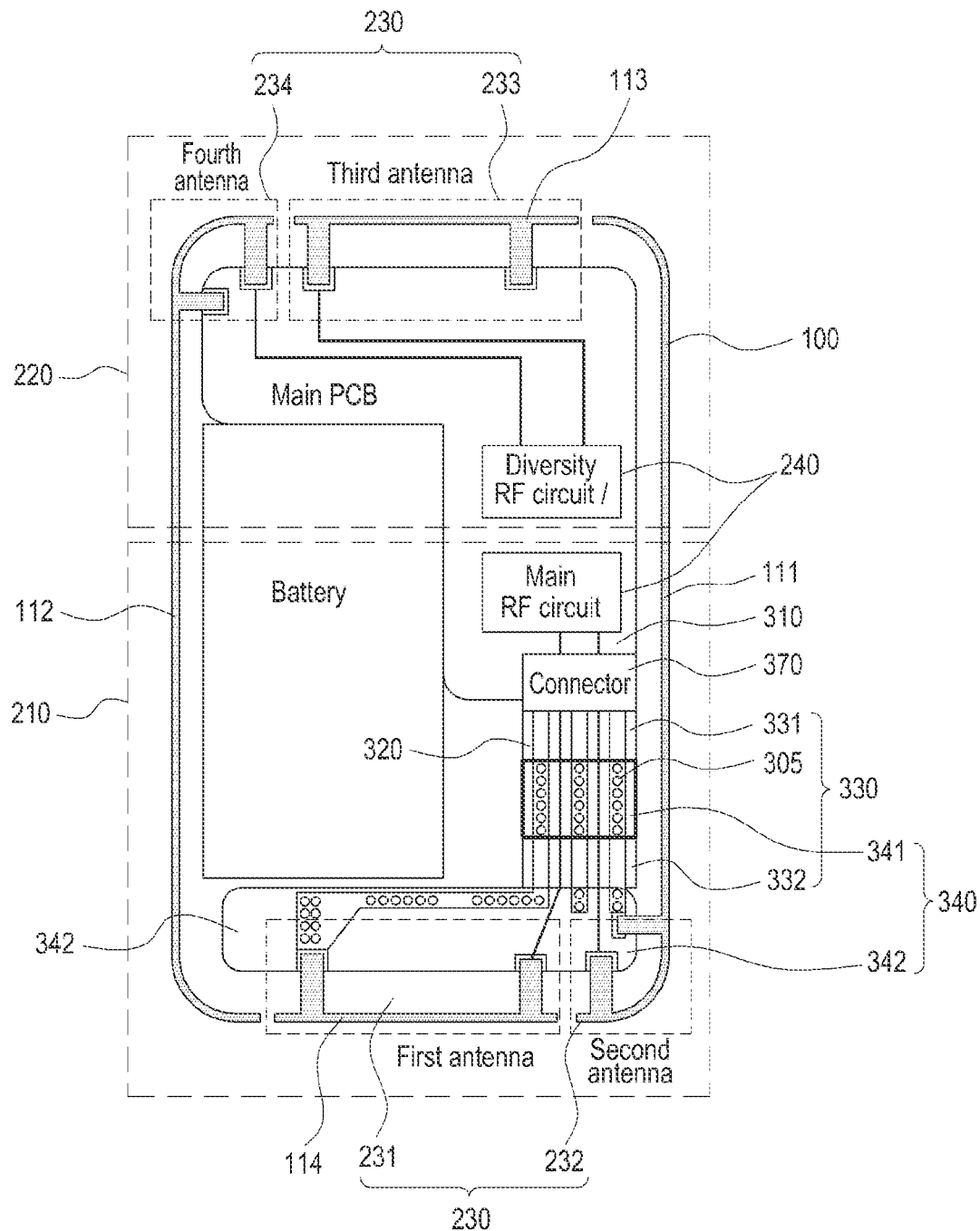
FIG. 10 illustrates an antenna device and a PCB in an electronic device according to an embodiment of the present disclosure.

FIG. 10 illustrates an antenna device and a PCB of an electronic device according to an embodiment of the present disclosure. Referring to FIG. 10, a main RF circuit in the main part 210 may supply electrical power to the first and second antennas 231 and 232 connected thereto through the connector 370 and the second PCB 320 using RF signal lines. The second PCB 320 may include the first FPCB 331, the first rigid PCB 341, the second FPCB 332, and the second rigid PCB 342. A ground may be removed from an antenna feeding part or from the surroundings of an antenna in order to enhance antenna characteristics.

According to an embodiment of the present disclosure, the metal bezel 110 may include the right bezel part 111, the left bezel part 112, the upper bezel part 113, and the lower bezel part 114 when viewed from the front. The upper bezel part 113 may be maintained separately from the right and left bezel parts 111 and 112 by a pair of cut-off portions that are formed with a predetermined interval therebetween. The lower bezel part 114 may be maintained separately from the right and left bezel parts 111 and 112 by a pair of cut-off portions that are formed with a predetermined interval therebetween. The pair of cut-off portions may be formed of a dielectric material. The pair of cut-off portions may be formed by double-injection molding or insert molding a synthetic resin into the metal bezel. Without being limited thereto, however, various types of electrical insulating materials may be applied to the pair of cut-off portions.

According to an embodiment of the present disclosure, a first feeding piece may be integrally formed with the lower bezel part 114 and may be supplied with electrical power by a first feeding part of the PCB. The first feeding piece of the lower bezel part 114 may be connected to the first feeding part of the PCB merely by installing the PCB in the electronic device, or may be electrically connected to the first feeding part by a separate electrical connection member (e.g., a C-clip, etc.).

According to an embodiment of the present disclosure, a first feeding pad may be disposed on the PCB and may be electrically connected to the first feeding piece of the lower bezel part 114. A first electrical path (e.g., an interconnection wire line) may be formed from the first feeding pad to the first feeding part. The first feeding piece may be integrally formed with the lower bezel part 114 and may be supplied with electrical power by the first feeding part of the PCB. The first feeding piece of the lower bezel part 114 may be connected to the first feeding part of the PCB merely by installing the PCB in the electronic device, or may be electrically connected to the first feeding part by a separate electrical connection member (e.g., a C-clip, etc.).

According to an embodiment of the present disclosure, the first feeding pad may be disposed on the PCB and may be electrically connected to the first feeding piece of the lower bezel part 114. The first electrical path (e.g., an interconnection wire line) may be formed from the first feeding pad to the first feeding part.

The lower bezel part may be a portion of the first antenna 231 of the main part 210 that supports an LB or H/MB band. The left and right bezel parts 112 and 111 may also be supplied with electrical power by the same method. The left and right bezel parts 112 and 111 may be portions of the second antenna 231 of the main part 210 that supports an LB or H/MB band.

According to an embodiment of the present disclosure, a first electrical connection piece may be integrally formed with the lower bezel part 114 so as to be located at a position separate from the first feeding piece by a predetermined distance, and may be grounded to a first ground part of the PCB. The first electrical connection piece of the lower bezel part 114 may be grounded to the first ground part of the PCB merely by installing the PCB in the electronic device, or may be electrically connected to the first ground part by a separate electrical connection member (e.g., a C-clip, etc.).

According to an embodiment of the present disclosure, a first ground pad may be disposed on the PCB and may be electrically connected to the first electrical connection piece of the lower bezel part 114. A second electrical path (e.g., an interconnection wire line) may be formed from the first ground pad to the first ground part.

According to an embodiment of the present disclosure, a second feeding piece may be integrally formed with the lower bezel part 114 and may be supplied with electrical power by a first feeding part of the PCB. The second feeding piece of the lower bezel part 114 may be connected to a second feeding part of the PCB merely by installing the PCB in the electronic device, or may be electrically connected to the second feeding part by a separate electrical connection member (e.g., a C-clip, etc.).

According to an embodiment of the present disclosure, a second feeding pad may be disposed on the PCB and may be electrically connected to the second feeding piece of the lower bezel part 114. A third electrical path (e.g an interconnection wire line) may be formed from the second feeding pad to the second feeding part. The lower bezel part 114 may be a portion of the second antenna 232 of the main part 210 that supports an LB or H/MB band.

According to an embodiment of the present disclosure, a second electrical connection piece may be integrally formed with the right bezel part 111 so as to be located at a position separate from the cut-off portions by a predetermined distance, and may be grounded to a second ground part of the PCB. The second electrical connection piece of the right bezel part 111 may be grounded to a second ground part of the PCB merely by installing the PCB in the electronic device, or may be electrically connected to the second ground part by a separate electrical connection member (e.g., a C-clip, etc.).

According to an embodiment of the present disclosure, a second ground pad may be disposed on the PCB and may be electrically connected to the second electrical connection piece of the right bezel part 111. A fourth electrical path (e.g., an interconnection wire line) may be formed from the second ground pad to the second ground part.

For example, the feeding parts, the feeding pads, the ground parts, and the ground pads of the main part 210 may be disposed on the second PCB 320. The main part 210 and an RF circuit of the diversity part 220 may be disposed on the first PCB (main PCB) 310. The first and second PCBs may be connected by an FPCB. The first and second PCBs may be integrated with each other.

According to an embodiment of the present disclosure, the second rigid PCB 342 included in the second PCB 320 may be disposed at a lower vertical position than the first PCB (main PCB) 310. Accordingly, components included in the second rigid PCB 342 may be additionally spaced apart from the antenna. Further, relatively thick components, such as a USB connector and a speaker, can also be disposed on the second rigid PCB 342.

According to an embodiment of the present disclosure, a transmitted or received signal of the RF circuit of the main part 210 may be forwarded to the first and second feeding parts of the second PCB 320.

The diversity part 220 may include the third and fourth antennas 233 and 234. The third antenna 233 may include a part of the upper bezel part 113, and the fourth antenna 234 may include the left or right bezel part 112 or 111.

The third antenna 233 may support LB and H/MB bands, and the fourth antenna 234 may support an I1/MB band, Feeding parts, feeding pads, ground parts, and ground pads of the diversity part 220 may be disposed on the first PCB (main PCB) 310. Electrical paths connecting the feeding parts and the feeding pads and electrical paths connecting the ground parts and the ground pads in the diversity part 220 may be disposed on the first PCB (main PCB) 310.

According to an embodiment of the present disclosure, when the main part 210 uses the right bezel part 111 as the second antenna 232 for the purpose of signal separation between the antennas, the diversity part 220 may use the opposite left bezel part 112 as the fourth antenna 234. Alternately, when the main part 210 uses the left bezel part 112 as the second antenna 232, the diversity part 220 may use the opposite right bezel part 111 as the fourth antenna 234.

Figure 11:
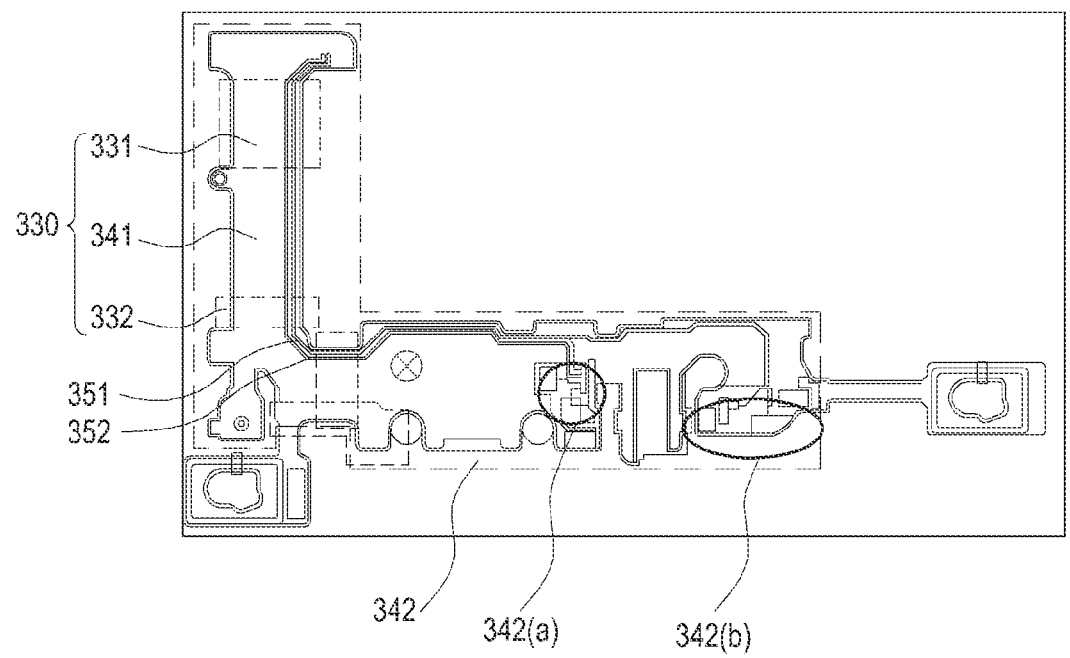
FIG. 11 is an illustration of a signal transmission using a second PCB according to an embodiment of the present disclosure.

FIG. 11 is an illustration of a signal transmission using the second PCB 320 according to an embodiment of the present disclosure. The second PCB 320 may be the same as the second PCBs 320, 420, and 520 described above with reference to FIGS. 1 to 7.

Referring to FIG. 11, the second. PCB 320 may include the FPCB 330 and the rigid PCB 340, which are integrated with each other. The second PCB 320 may include the first FPCB 331, the second. FPCB 332, the first rigid PCB 341, and the second rigid PCB 342.

According to an embodiment of the present disclosure, the electrical path 350 for transmitting a high-frequency signal may also transmit signals other than RF signals using the second PCB 320. The other signals may include, for example, a USB an ear-jack signal, a microphone (MIC) signal, a speaker signal, and a touch key signal.

According to an embodiment of the present disclosure, an antenna contact to which an RF signal is connected, and a USB connector, an ear-jack connector, a microphone (MIC) connector, and a speaker contact to which the other signals are connected may be disposed on the second rigid PCB 342. For example, RF signals may be transmitted through two electrical paths 350: the first electrical path 351 and the second electrical path 352. The ground line 360 may be disposed between the first and second electrical paths 351 and 352 to prevent the first and second electrical paths 351 and 352 from mutually affecting the characteristics thereof. The conductive vias 305 may be arranged in the region where the ground line 360 and the first rigid PCB 341 cross each other, and may be connected to a ground in a different layer. A rigid PCB connected to the rear end of the second rigid PCB 342 may be various types of modules of the electronic device, and may function as a touch key, for example.

According to an embodiment of the present disclosure, a first connector 342(*a*) connected to the first electrical path 351 may be a first antenna contact, a first USB connector, a first ear-jack connector, a first MIC connector, or a first speaker contact, and a second connector 342(*b*) connected to the second electrical path 352 may be a second antenna contact, a second USB connector, a second ear-jack connector, a second MIC connector, and a second speaker contact.

Figure 12:
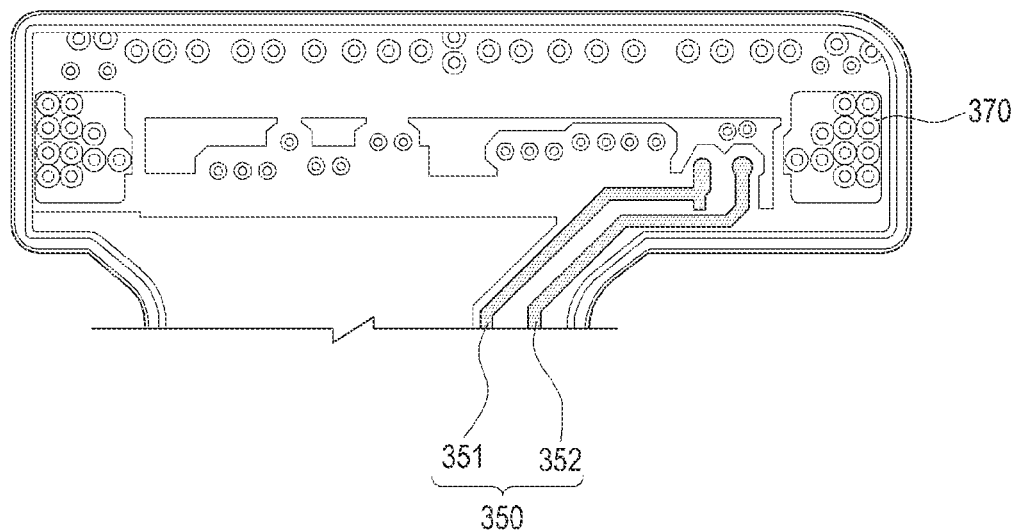
FIGS. 12 and 13 are enlarged views of a first FPCB and a first rigid PCB.
Figure 13:
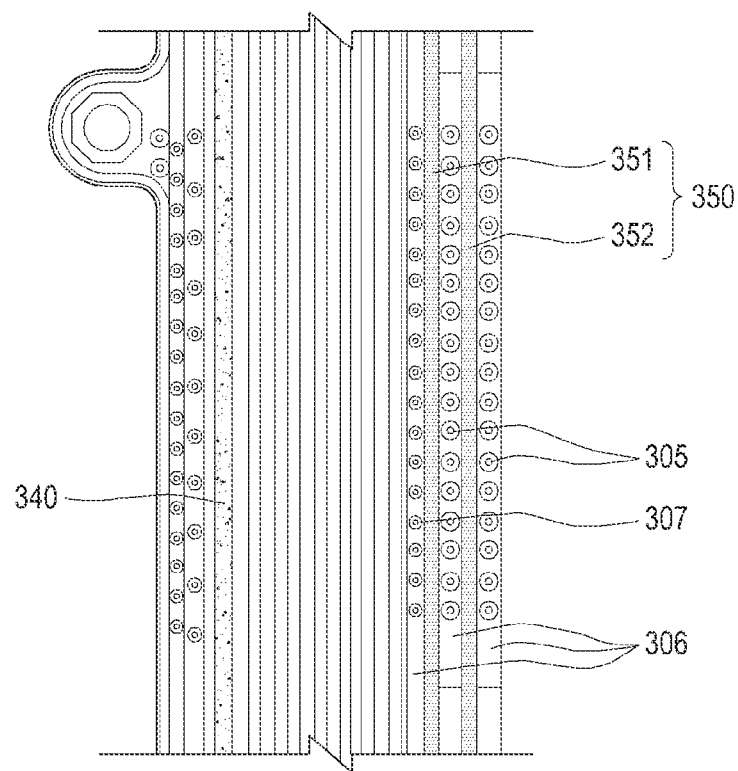

FIGS. 12 and 13 are enlarged views of a first FPCB and a first rigid PCB. The second PCB 320 may be one of the second PCBs 320, 420, 520, 620, and 720 described above with reference to FIGS. 1 to 7.

Referring to FIGS. 12 and 13, a high-frequency signal may be connected from a B-to-B-type connector A of the connector 370 to antenna (ANT) feeding B and C by a micro strip line or a strip line on the FPCB. Further, the ground lines 306 may exist on the left and right sides of the electrical path 350 through which an RF signal is transmitted on the connector, and may be formed parallel to the electrical path 350 along the lengthwise direction of the electrical path 350 so as to be connected to the ANT feeding B and C. In addition, the conductive vias 305 may be formed in the ground lines 306. Conductive vias 307 lesser in size than the conductive vias 305 may be formed on the right side of the electrical path 351 so as to prevent contact between the ground lines and a signal line on one side.

An electronic device according to an embodiment of the present disclosure includes a housing; a PCB disposed in the housing, the PCB including a plurality of layers that include one or more conductive layers and one or more insulation layers; a first electrical component formed to be at least a part of the housing or disposed in the housing; a second electrical component disposed above or near the PCB in the housing, the second electrical component being separated from the first electronic component; and at least one electrical path extending from the first electrical component to the second electronic component, wherein at least a portion of the electrical path runs on or inside the PCB, wherein the PCB may include a region including a pattern of conductive vias, each of the vias extending through at least a part of the plurality of layers to contact at least one of the one or more conductive layers, and wherein the electrical path may run through the region without making contact with the conductive vias.

According to an embodiment of the present disclosure, the first electrical component may include an antenna radiator and the second electrical component may include a communication circuit.

According to an embodiment of the present disclosure, the antenna radiator may form at least one part of the housing.

According to an embodiment of the present disclosure, the pattern of the conductive vias lit a y be aligned in one or more rows or columns along the electrical path when viewed from above the region of the PCB.

According to an embodiment of the present disclosure, the PCB may include an FPCB as at least a part thereof, where the FPCB may transmit a signal through the electrical path.

According to an embodiment of the present disclosure, the PCB may include a first PCB; and a second. PCB connected to the first PCB through a connector, where the second PCB includes at least one FPCB and at least one rigid PCB, and where the electrical path may transmit a high-frequency signal through the connector and may pass over or through the second PCB.

According to an embodiment of the present disclosure, the electronic device may further include a ground line disposed around the electrical path so as to be adjacent thereto, where the ground line may be connected to the one or more conductive layers through the conductive vias in the rigid PCB.

According to an embodiment of the present disclosure, the second PCB may include a first FPCB connected to the first PCB through a communication circuit; a second PCB disposed to face the first flexible PCB with a separation distance therebetween; and a first rigid PCB disposed between the first and second FPCBs, where the first rigid PCB includes the pattern of the conductive vias.

According to an embodiment of the present disclosure, the electronic device may further include a second rigid PCB connected to the second FPCB, wherein a part of the antenna radiator that forms at least one portion of the housing may be disposed on the second rigid PCB.

According to an embodiment of the present disclosure, at least one of the plurality of layers may form a ground pattern in the ground line of the second PCB, where the entire line of the ground pattern includes a ground.

According to an embodiment of the present disclosure, the conductive vias of the first rigid PCB may include a first conductive via passing through all of the plurality of layers; and a second conductive via passing through some of the plurality of layers, and where the first conductive via may connect the ground pattern disposed on all or some of the layers and the ground line.

According to an embodiment of the present disclosure, a plurality of ground lines may be formed on the rigid PCB so as to be spaced apart from the electrical path, and may have different widths.

According to an embodiment of the present disclosure, the conductive vias formed along the width of the ground line may include a third conductive via having a first hole size; and a fourth via having a second hole size that differs from the first hole size.

According to an embodiment of the present disclosure, a space for mounting an electronic component may be formed on or in the rigid PCB of the second PCB.

According to an embodiment of the present disclosure, the connector may be disposed on one side of the first or second PCB, where the electrical path passing over or through the second PCB may be connected to the first PCB.

According to an embodiment of the present disclosure, the connector may include a first connector disposed on one end of the first FPCB of the second PCB; and a second connector disposed on one end of the second FPCB of the second PCB.

According to an embodiment of the present disclosure, the electronic device may include a plurality of electrical paths and a plurality of antenna radiators, wherein the electrical paths may be connected to the respective antenna radiators corresponding thereto, and the ground line may be disposed between the plurality of electrical paths.

According to an embodiment of the present disclosure, the first PCB may include at least a part of the first electrical component and may be connected to the antenna radiator, and the second PCB may have the second electrical component disposed thereon.

According to an embodiment of the present disclosure, the FPCB and the rigid PCB of the second PCB may be integrated with each other.

According to an embodiment of the present disclosure, the region of the PCB may be a rigid PCB region, and the electronic device may include a first FPCB region disposed between the first electrical component and the region; and a second FPCB region disposed between the second electrical component and the region.

An electronic device according to an embodiment of the present disclosure includes a first PCB; a second PCB connected with the first PCB through a connector and including at least one FPCB and at least one rigid PCB that are integrated with each other, where the flexible and rigid PCBs include a plurality of layers; an electrical path that transmits a high-frequency signal through the connector and passes over or through the second PCB; and at least one conductive via disposed in the rigid PCB to connect grounds between the plurality of layers.

Figure 14:
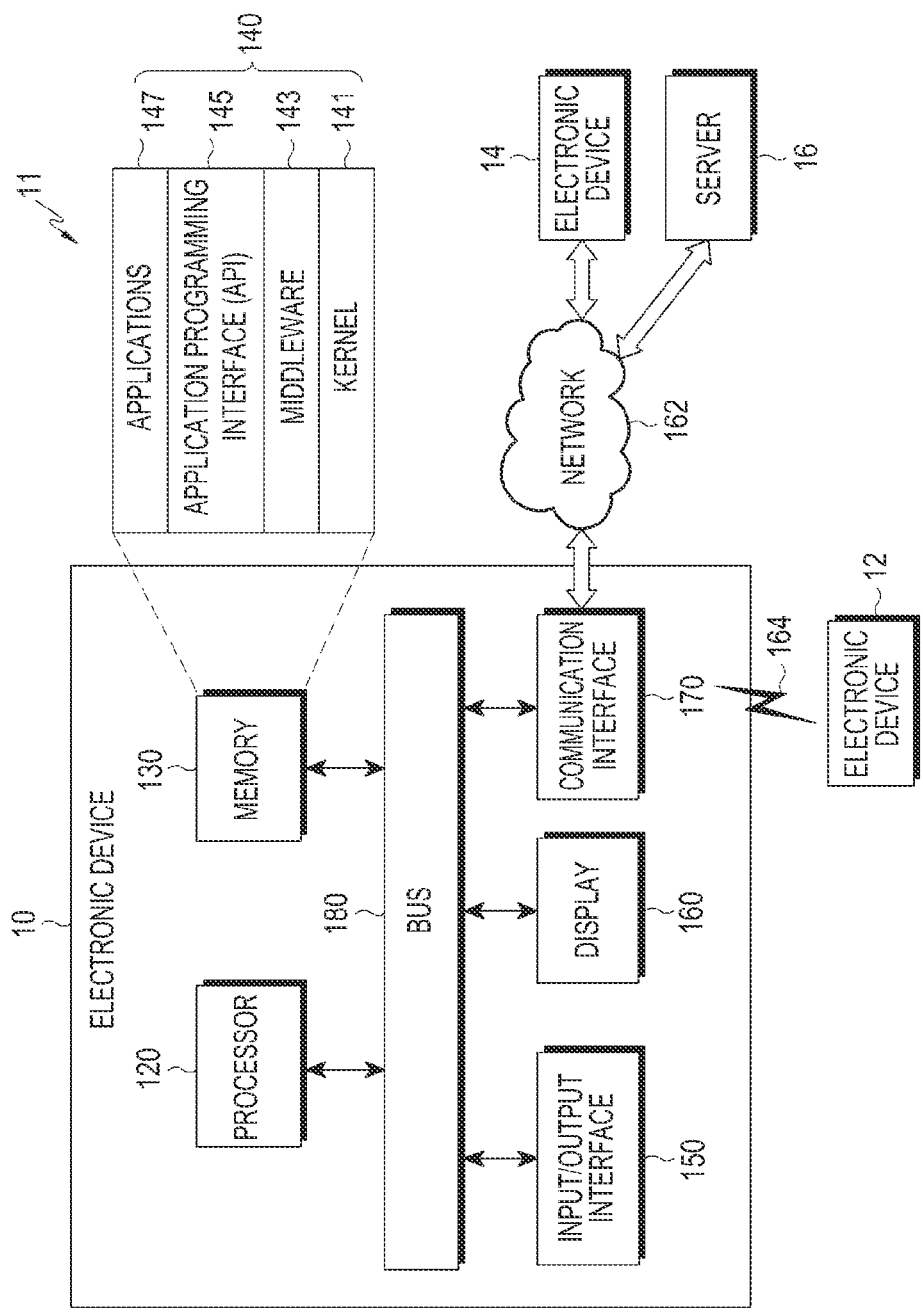
FIG. 14 is a block diagram of an electronic device according to an embodiment of the present disclosure in a network environment.

FIG. 14 is a block diagram of an electronic device 10, according to an embodiment of the present disclosure, in a network environment 11.

Referring to FIG. 14, the electronic device 10 may include a bus 180, a processor 120, a memory 130, an input/output interface 150, a display 160, and a communication interface 170. The electronic device 10 may omit at least one of the elements, or may further include other elements.

The bus 180 may include, for example, a circuit that interconnects the elements 120 to 170 and delivers communication (for example, a control message and/or data) between the elements.

The processor 120 may include one or more of a CPU, an AP, and a CR For example, the processor 120 may carry out operations or data processing relating to the control and/or communication of at least one other element of the electronic device 10.

The memory 130 may include a volatile and/or non-volatile memory. For example, the memory 130 may store instructions or data relevant to at least one other element 120 to 170 of the electronic device 10. The memory 130 may store software and/or a program 140. The program 140 may include, for example, a kernel 141, middleware 143, an application programming interface (API) 145, and/or application programs (or applications) 147. At least some of the kernel 141, the middleware 143, and the API 145 may be referred to as an operating system (OS).

For example, the kernel 141 may control or manage system resources (for example, the bus 180, the processor 120, and the memory 130) that are used to execute operations or functions implemented by the other programs (for example, the middleware 143, the API 145, and the applications 147). Furthermore, the kernel 141 may provide an interface by which the middleware 143, the API 145, or the applications 147 access the individual elements of the electronic device 10 to control or manage the system resources.

For example, the middleware 143 may serve as an intermediary to allow the API 145 or the applications 147 to exchange data with the kernel 141 through communication.

Furthermore, the middleware 143 may process one or more task requests received from the applications 147 according to the priorities of the requests. For example, the middleware 143 may assign, to at least one of the applications 147, a priority to use the system resources (for example, the bus 180, the processor 120, and the memory 130) of the electronic device 10. For example, the middleware 143 may perform scheduling or loading balancing on the one or more task requests by processing the one or more task requests according to the priority assigned to the at least one of the applications.

The API 145 is, for example, an interface by which the applications 147 control functions provided by the kernel 141 or the middleware 143, and the API 145 may include at least one interface or function (for example, an instruction) for file control, window control, image processing, or text control, for example.

The input/output interface 150 may serve as, for example, an interface that can forward instructions or data input from a user or an external device to the other element(s) 120 to 170 of the electronic device 10. Furthermore, the input/output interface 150 may output instructions or data received from the other element(s) of the electronic device 10 to the user or the external device.

Examples of the display 160 may include a liquid crystal display (LCD), an LED display, an organic LED (OLED) display, a microelectromechanical systems (MEMS) display, and an electronic paper display. For example, the display 160 may display various types of content (for example, text, images, videos, icons, or symbols) for a user. The display 160 may include a touch screen, and may receive, for example, a touch, gesture, a proximity input, or a hovering input using an electronic pen or a part of a user's body.

For example, the communication interface 170 may establish communication between the electronic device 10 and a first external electronic device 12, a second external electronic device 11, or a server 16. For example, the communication interface 170 may be connected to a network 162 through wireless or wired communication to communicate with the second external electronic device 14 or the server 16.

The wireless communication may use, for example, at least one of long term evolution (LTE), LTE-advanced (LTE-A), code division multiple access (CDMA), wideband CDMA (WCDMA), universal mobile telecommunications system (UMTS), wireless broadband (WiBro), and global system for mobile communications (GSM), for example, as a cellular communication protocol. Furthermore, the wireless communication may include short range communication 164, for example. The short range communication 164 may include, for example, at least one of wireless fidelity (WiFi), Bluetooth (BT), near field communication (NFC), and global navigation satellite system (GNSS). Depending on the service area and the bandwidth, the GNSS may include, for example, at least one of a global positioning system (GPS), a global navigation satellite system (Glonass), a Beidou navigation satellite system (Beidou), and a European global satellite-based navigation system (Galileo). Hereinafter, "GPS" may be interchangeably used with "GNSS." The wired communication may include, for example, at least one of a USB, a high definition multimedia interface (HDMI), recommended standard 232 (RS-232), and a plain old telephone service (POTS). The network 162 may include at least one of a communication network such as a computer network (e.g., a local area network (LAN) or a wide area network (WAN)), the Internet, and a telephone network.

Each of the first and second external electronic devices 12 and 14 may be of the same or a different type from the electronic device 10. According to an embodiment of the present disclosure, the server 16 may include a group of one or more servers. All or some of the operations executed in the electronic device 10 may be executed in the electronic device 102, the electronic device 104, or the server 16. When the electronic device 10 must perform a function or service automatically or in response to a request, the electronic device 10 may request the electronic device 12, the electronic device 14, or the server 16 to perform at least some functions relating thereto, instead of or in addition to performing the function or service by itself. The electronic device 102, the electronic device 104, or the server 106 may execute the requested function or additional functions and then deliver the result to the electronic apparatus 10. The electronic device 10 may provide a received result as is, or may further process the received result to provide the requested function or service. To this end, for example, cloud computing, distributed computing, or client-server computing technology may be used.

The electronic device 10, which is described below in greater detail, may be one of a wearable device, a notebook computer, a net-book computer, a smart phone, a tablet PC, a Galaxy tab, an i-Pad, and a wireless charging device mentioned above. In this embodiment, the electronic device 10 may be a smart phone.

The wireless charging device, according to an embodiment of the present disclosure, refers to a device that recharges the electronic device by wirelessly transmitting and receiving power in a short range.

In addition, the display 160 of the electronic device 10 may increase in size and may implement a luxurious design by minimizing the bezel area thereof, or may be implemented to be flexible, convex, or concave.

Namely, the peripheral portion of the display 160 may be bent to allow a view area to extend to the lateral portion. As the view area of the display 160 is bent to extend to the lateral, the view area may be enlarged, a separate screen may be used on the lateral portion, or a luxurious design may be implemented. In other words, the display 160 may include a first view area and second view areas on opposite sides of the first view area.

Figure 15:
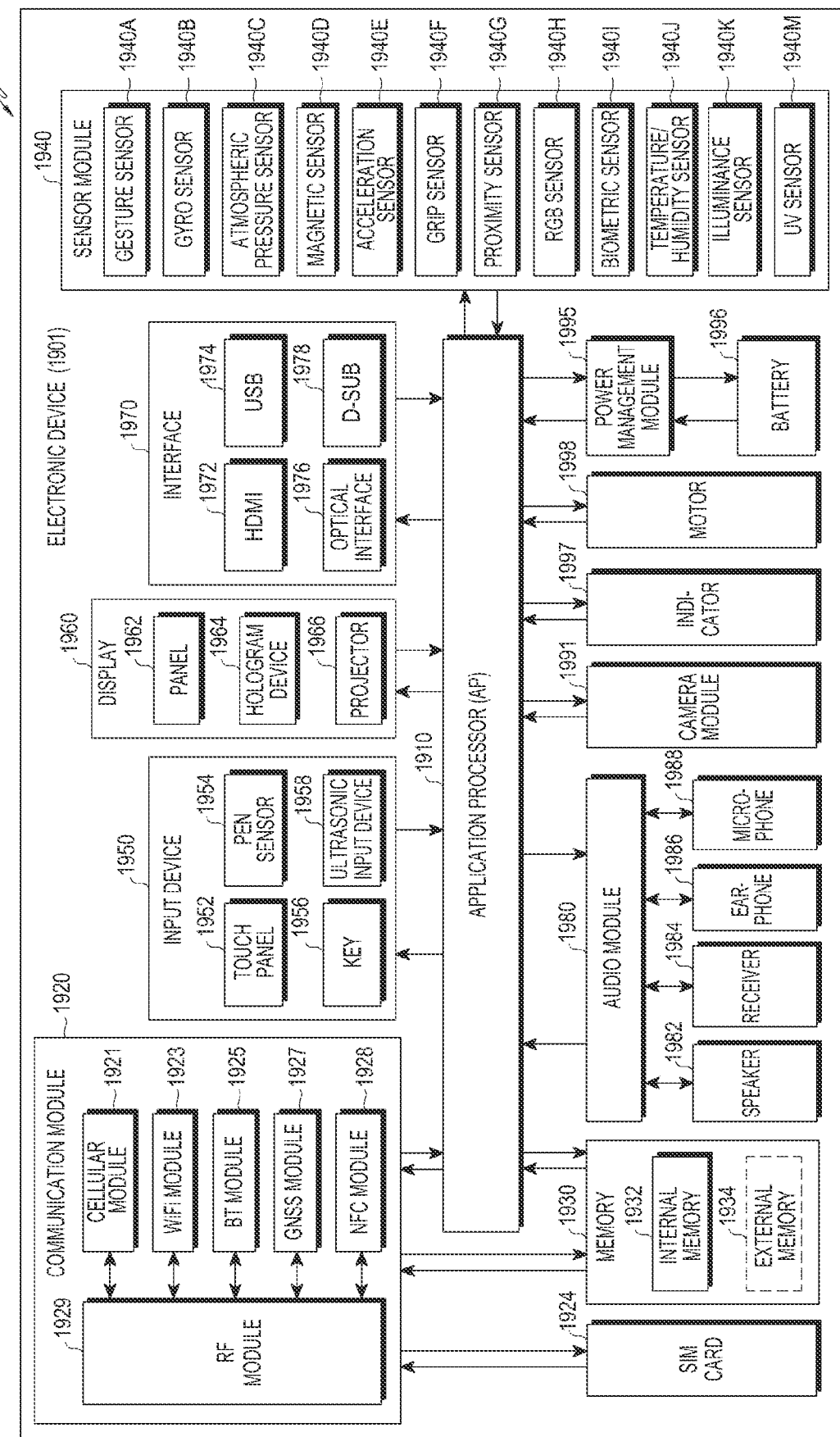
FIG. 15 is a block diagram of an electronic device according to an embodiment of the present disclosure.

FIG. 15 is a block diagram of an electronic device 1901 according to an embodiment of the present disclosure. The electronic device 1901 may include, for example, the entirety or a part of the electronic device 10 described above with reference to FIG. 14. The electronic device 1901 in FIG. 15 may include at least one processor (e.g., an AP) 1910, a communication module 1920, a subscriber identification module card 1924, a memory 1930, a sensor module 1940, an input device 1950, a display 1960, an interface 1970, an audio module 1980, a camera module 1991, a power management module 1995, a battery 1996, an indicator 1997, and a motor 1998.

The processor 1910 may operate, for example, an OS or an application program to control a plurality of hardware or software elements connected to the processor 1910 and to perform various types of data processing and operations. The processor 1910 may be implemented to be a system on chip (SoC), for example. According to an embodiment of the present disclosure, the processor 1910 may further include a graphics processing unit (GPU) and/or an image signal processor. The processor 1910 may also include at least some (for example, a cellular module 1921) of the elements illustrated in FIG. 15. The processor 1910 may load, in a volatile memory, instructions or data received from at least one of the other elements (for example, a non-volatile memory) to process the loaded instructions or data, and may store various types of data in the non-volatile memory.

The configuration of the communication module 1920 may be the same as or similar to that of the communication interface 170 of FIG. 14. The communication module 1920 may include, for example, a cellular module 1921, a WiN module 1923, a BT module 1925, a GNSS module 1927 (for example, a GPS module, a Glonass module, a Beidou module, or a Galileo module), an NFC module 1928, and an RF module 1929.

The cellular module 1921 may provide, for example, a voice call, a video call, a text message service, or an Internet service through a communication network. According to an embodiment of the present disclosure, the cellular module 1921 may identify and authenticate the electronic device 1901 in a communication network using the subscriber identification module card (SIM card) 1924. The cellular module 1921 may perform at least some of the functions that the processor 1910 can provide. The cellular module 1921 may include a CP.

The WiFi module 1923, the BT module 1925, the GNSS module 1927, and the NFC module 1928 may each include, for example, a processor for processing data transmitted and received through the corresponding module. According to an embodiment of the present disclosure, at least some (for example, two or more) of the cellular module 1921, the WiFi module 1923, the BT module 1925, the GNSS module 1927, and the NFC module 1928 may be included in one integrated circuit (IC) or IC package.

The RF module 1929 may transmit and receive, for example, a communication signal (for example, an RF signal). The RF module 1929 may include, for example, a transceiver, a power amplifier module (PAM), a frequency filter, a low noise amplifier (LNA), or an antenna. At least one of the cellular module 1921, the WiFi module 1923, the BT module 1925, the GNSS module 1927, and the NFC module 1928 may transmit and receive an RF signal through a separate RF module.

The subscriber identification module card 1924 may include, for example, an embedded SIM, and may include unique identification information (for example, an integrated circuit card identifier (ICCID)) or subscriber information (for example, an international mobile subscriber identity (IMSI)).

The memory 1930 (for example, the memory 130 in FIG. 14) may include, for example, an internal memory 1932 or an external memory 1934. The internal memory 1932 may include, for example, at least one of a volatile memory (for example, a dynamic random access memory (DRAM), a static RAM (SRAM), or a synchronous DRAM (SDRAM)) and a non-volatile memory (for example, a one-time programmable read only memory (OTPROM), a programmable ROM (PROM), an erasable and programmable ROM (EPROM), an electrically erasable PROM (EEPROM), a mask ROM, a flash ROM, a flash memory (for example, a NAND flash memory or a NOR flash memory), a hard disc drive, or a solid state drive (SSD)).

The external memory 1934 may further include a flash drive, which may be, for example, a compact flash (CF)

drive, a secure digital (SD) memory card, a micro SD (Micro-SD) memory card, a a mini SD (Mini-SD) memory card, an extreme digital (xD) memory card, a multi-media card (MMC), or a memory stick. The external memory 1934 may be functionally and/or physically connected to the electronic device 1901 through various interfaces.

For example, the sensor module 1940 may measure a physical quantity, or may sense an operating state of the electronic device 1901, to convert the measured or sensed information into an electrical signal. The sensor module 1940 may include, for example, at least one of a gesture sensor 1940A, a gyro sensor 1940B, an atmospheric pressure sensor 1940C, a magnetic sensor 1940D, an acceleration sensor 1940E, a grip sensor 1940F, a proximity sensor 1940G, a color sensor 1940H (for example, a red, green, blue (RGB) sensor), a biometric sensor 1940I, a temperature/humidity sensor 1940J, an illuminance sensor 1940K, and a ultraviolet (UV) light sensor 1940M. Additionally or alternatively, the sensor module 1940 may include, for example, an electronic nose (E-nose) sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1940 may further include a control circuit for controlling one or more sensors included therein. In an embodiment of the present disclosure, the electronic device 1901 may further include a processor configured to control the sensor module 1940 as a part of the processor 1910 or separately from the processor 1910 to control the sensor module 1940 while the processor 1910 is in a reduced power or sleep state.

The input device 1950 may include, for example, a touch panel 1952, a (digital) pen sensor 1954, a key 1956, or an ultrasonic input device 1958. The touch panel 1952 may use, for example, at least one of a capacitive type panel, a resistive type panel, an infrared type panel, and an ultrasonic type panel. Furthermore, the touch panel 1952 may further include a control circuit. The touch panel 1952 may further include a tactile layer to provide a tactile reaction to a user.

The (digital) pen sensor 1954 may include, for example, a recognition sheet that is a part of, or separate from, the touch panel. The key 1956 may include, for example, a physical button, an optical key, or a keypad. The ultrasonic input device 1958 may sense ultrasonic waves generated by an input tool through a microphone 1988 and may identify data corresponding to the sensed ultrasonic waves.

The display 1960 (for example, the display 160 in FIG. 14) may include a panel 1962, a hologram device 1964, or a projector 1966. The panel 1962 may have a configuration that is the same as, or similar to, that of the display 160 illustrated in FIG. 1. The panel 1962 in FIG. 15 may be implemented to be, for example, flexible, transparent, or wearable. The panel 1962, together with the touch panel 1952, may be implemented to be one module. The hologram device 1964 may show a three-dimensional image in the air by using an interference of light. The projector 1966 may project light onto a screen to display an image. The screen may be located, for example, inside or outside of the electronic device 1901. According to an embodiment of the present disclosure, the display 1960 may further include a control circuit for controlling the panel 1962, the hologram device 1964, and the projector 1966.

The interface 1970 may include, for example, an EIDMI 1972, a USB 1974, an optical interface 1976, or a D-sub-miniature (D-sub) connector 1978. The interface 1970 may be included, for example, in the communication interface 170 illustrated in FIG. 3. Additionally or alternatively, the interface 1970 in FIG. 15 may include, for example, a mobile high-definition link (MHL) interface, an SD card/MMC interface, or an Infrared Data Association (IrDA) standard interface.

For example, the audio module 1980 may convert a sound into an electrical signal, and vice versa. At least some elements of the audio module 1980 may be included, for example, in the input/output interface 145 illustrated in FIG. 1. The audio module 1980 in FIG. 15 may process sound information that is input or output, for example, through a speaker 1982, a receiver 1984, an earphone 1986, or the microphone 1988.

The camera module 1991 is a device that can photograph a still image and a dynamic image. According to an embodiment of the present disclosure, the camera module 1991 may include one or more image sensors (for example, a front sensor or a rear sensor), a lens, an image sensor processor (ISP), or a flash (for example, an LED or a xenon lamp).

The power management module 1995 may manage, for example, power of the electronic device 1901. According to an embodiment of the present disclosure, the power management module 1995 may include a power management IC (PMIC), a charger IC, or a battery gauge. The PMIC may use a wired and/or wireless charging method. Examples of the wireless charging method may include a magnetic resonance method, a magnetic induction method, and an electromagnetic wave method. An additional circuit (for example, a coil loop, a resonance circuit, or a rectifier) for wireless charging may be further included. The battery gauge may measure, for example, a residual amount of the battery 1996 and a voltage, current, or temperature while charging. The battery 1996 may include, for example, a rechargeable battery and/or a solar battery.

The indicator 1997 may indicate a particular state (for example, a booting state, a message state, or a charging state) of the electronic device 1901 or a part thereof (for example, the processor 1910). The motor 1998 may convert an electrical signal into a mechanical vibration and may generate a vibration or a haptic effect. The electronic device 1901 may include a processing unit (for example, a GPU) for supporting mobile TV. The processing unit for supporting mobile TV may process media data according to a standard, such as digital multimedia broadcasting (DMB), digital video broadcasting (DVB), or MediaFlo™.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. In addition, some of the hardware components according to various embodiments may be combined into one entity, which may perform functions identical to those of the relevant components before the combination.

While the present disclosure has been shown and described with reference to certain embodiments thereof, it will be apparent to those skilled in the art that the camera lens module according to the present disclosure is not limited to these embodiments, and various changes in form and details may be made therein without departing from the scope of the present disclosure as defined by the appended claims and their equivalents.

What is claimed is:

1. An electronic device comprising:
a first component;
a second component; and
a signal path interface coupled between the first component and the second component, the signal path interface including a printed circuit board (PCB) having a rigid PCB portion and a flexible PCB portion,
wherein a first signal line extends through the rigid PCB portion and the flexible PCB portion for transmitting signals from the first component to the second components, a second signal line arranged parallel to the first signal line extends through the rigid PCB portion and the flexible PCB portion for transmitting signals from the first component to the second components, and a plurality of ground lines extend through the rigid PCB portion and the flexible PCB portion, and
wherein each of the plurality of ground lines extending through the rigid PCB portion is connected to one or more conductive layers through conductive vias.

2. The electronic device of claim 1,
wherein the first component comprises a communication module, and the second component comprises an antenna radiator, and
wherein the first signal line and the second signal line extending through the signal path interface are configured to transmit high-frequency signals from the communication module to the antenna radiator.

3. The electronic device of claim 2,
wherein the plurality of ground lines includes a first ground line, a second ground line at least partially spaced apart from the first ground line, and a third ground line located between the first signal line and the second signal line,
wherein first signal line is located between the first ground line and the second ground line, and
wherein the second signal line is located between the first signal line and the second ground line.

4. The electronic device of claim 2,
wherein the PCB includes an insulating layer on which the first ground line, the second ground line, the third ground line, the first signal line, and the second signal line are located, and a ground plate located below the insulating layer.

5. The electronic device of claim 4,
wherein the ground plate is electrically connected with the first ground line through a first conduction via formed in a first portion of the insulating layer, the second ground line through a second conduction via formed in a second portion of the insulating layer, and the third ground line through a third conduction via formed in a third portion of the insulating layer.

* * * * *